United States Patent
Endo et al.

(10) Patent No.: US 10,031,429 B2
(45) Date of Patent: Jul. 24, 2018

(54) METHOD OF OBTAINING POSITION, EXPOSURE METHOD, AND METHOD OF MANUFACTURING ARTICLE

(71) Applicant: CANON KABUSHIKI KAISHA, Tokyo (JP)

(72) Inventors: Masatoshi Endo, Utsunomiya (JP); Akihiko Kawamura, Tokyo (JP); Naoto Ohkawa, Utsunomiya (JP); Tetsuji Kazaana, Utsunomiya (JP); Takanori Morooka, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 758 days.

(21) Appl. No.: 14/477,477

(22) Filed: Sep. 4, 2014

(65) Prior Publication Data
US 2015/0074621 A1     Mar. 12, 2015

(30) Foreign Application Priority Data

Sep. 10, 2013 (JP) ................................. 2013-187644

(51) Int. Cl.
G06F 17/50 (2006.01)
G03F 9/00 (2006.01)

(52) U.S. Cl.
CPC ................................. *G03F 9/7046* (2013.01)

(58) Field of Classification Search
USPC .......................................................... 716/54
See application file for complete search history.

(56) References Cited

U.S. PATENT DOCUMENTS 5,561,606 A * 10/1996 Ota ........................ G03F 9/7003
430/22
2010/0092878 A1    4/2010 Wang
2010/0159701 A1    6/2010 Song et al.

FOREIGN PATENT DOCUMENTS

| JP | 10284396 A | 10/1998 |
| JP | H11195596 A | 7/1999 |
| JP | 2001223150 A | 8/2001 |
| JP | 2008209949 A | 9/2008 |
| TW | 200520054 A | 6/2005 |
| TW | 200705138 A | 2/2007 |

OTHER PUBLICATIONS

Taiwanese Office Action issued in Taiwanese counterpart application No. TW103127756, dated Aug. 3, 2015. English translation provided.
Office Action issued in Japanese Patent Application No. 2013187644 dated Apr. 28, 2017.

* cited by examiner

*Primary Examiner* — Eric Lee
(74) *Attorney, Agent, or Firm* — Rossi, Kimms & McDowell LLP

(57) ABSTRACT

The present invention provides a method of obtaining a position of a second shot region next to a first shot region, out of a plurality of shot regions formed on a substrate, comprising a first detection step of detecting a position of a first mark arranged in the first shot region, a second detection step of detecting a position of a mark more distant from the first mark, out of a second mark and a third mark arranged in the second shot region, and a determination step of determining the position of the second shot region based on a detection result in the first detection step and a detection result in the second detection step.

27 Claims, 17 Drawing Sheets

FIG. 5

| | R | 15μm 70 | | | |
|---|---|---|---|---|---|
| | | Direction | X(um) | Y(um) | Center |
| Mark1 | | XY 71 | 10μm 76 | 15μm 81 | ✓ 86 |
| Mark2 | | X 72 | 10μm 77 | -15μm 82 | 87 |
| Mark3 | | Y 73 | -10μm 78 | 15μm 83 | 88 |
| Mark4 | | XY 74 | -10μm 79 | -15μm 84 | 89 |

| | MARK SHAPE | MARK TYPE | GROUP | DETECTION STATE | X POSITION DATA | Y POSITION DATA |
|---|---|---|---|---|---|---|
| $S_1M_1XY$ | XY MARK | DETECTION MARK | | | | |
| $S_1M_2X$ | X MARK | SUBSTITUTION MARK | $S_9C$ | MEASUREMENT UNEXECUTED | | |
| $S_1M_3Y$ | Y MARK | SUBSTITUTION MARK | $S_2C$ | MEASUREMENT UNEXECUTED | | |
| $S_1M_4XY$ | XY MARK | SUBSTITUTION MARK | $S_8C$ | MEASUREMENT UNEXECUTED | | |
| $S_2M_1XY$ | XY MARK | DETECTION MARK HAVING SUBSTITUTION MARK | $S_2C$ | MEASUREMENT UNEXECUTED | | |
| $S_2M_2X$ | X MARK | SUBSTITUTION MARK | $S_8C$ | MEASUREMENT UNEXECUTED | | |
| $S_2M_3Y$ | Y MARK | SUBSTITUTION MARK | $S_3C$ | MEASUREMENT UNEXECUTED | | |
| $S_2M_4XY$ | XY MARK | SUBSTITUTION MARK | $S_7C$ | MEASUREMENT UNEXECUTED | | |
| $S_8M_1XY$ | XY MARK | DETECTION MARK HAVING SUBSTITUTION MARK | $S_8C$ | MEASUREMENT UNEXECUTED | | |
| $S_8M_2X$ | X MARK | SUBSTITUTION MARK | $S_{13}C$ | MEASUREMENT UNEXECUTED | | |
| $S_8M_3Y$ | Y MARK | SUBSTITUTION MARK | $S_7C$ | MEASUREMENT UNEXECUTED | | |
| $S_8M_4XY$ | XY MARK | SUBSTITUTION MARK | $S_{14}C$ | MEASUREMENT UNEXECUTED | | |
| $S_9M_1XY$ | XY MARK | DETECTION MARK HAVING SUBSTITUTION MARK | $S_9C$ | MEASUREMENT UNEXECUTED | | |
| $S_9M_2X$ | X MARK | SUBSTITUTION MARK | $S_{12}C$ | MEASUREMENT UNEXECUTED | | |
| $S_9M_3Y$ | Y MARK | SUBSTITUTION MARK | $S_8C$ | MEASUREMENT UNEXECUTED | | |
| $S_9M_4XY$ | XY MARK | SUBSTITUTION MARK | $S_{13}C$ | MEASUREMENT UNEXECUTED | | |

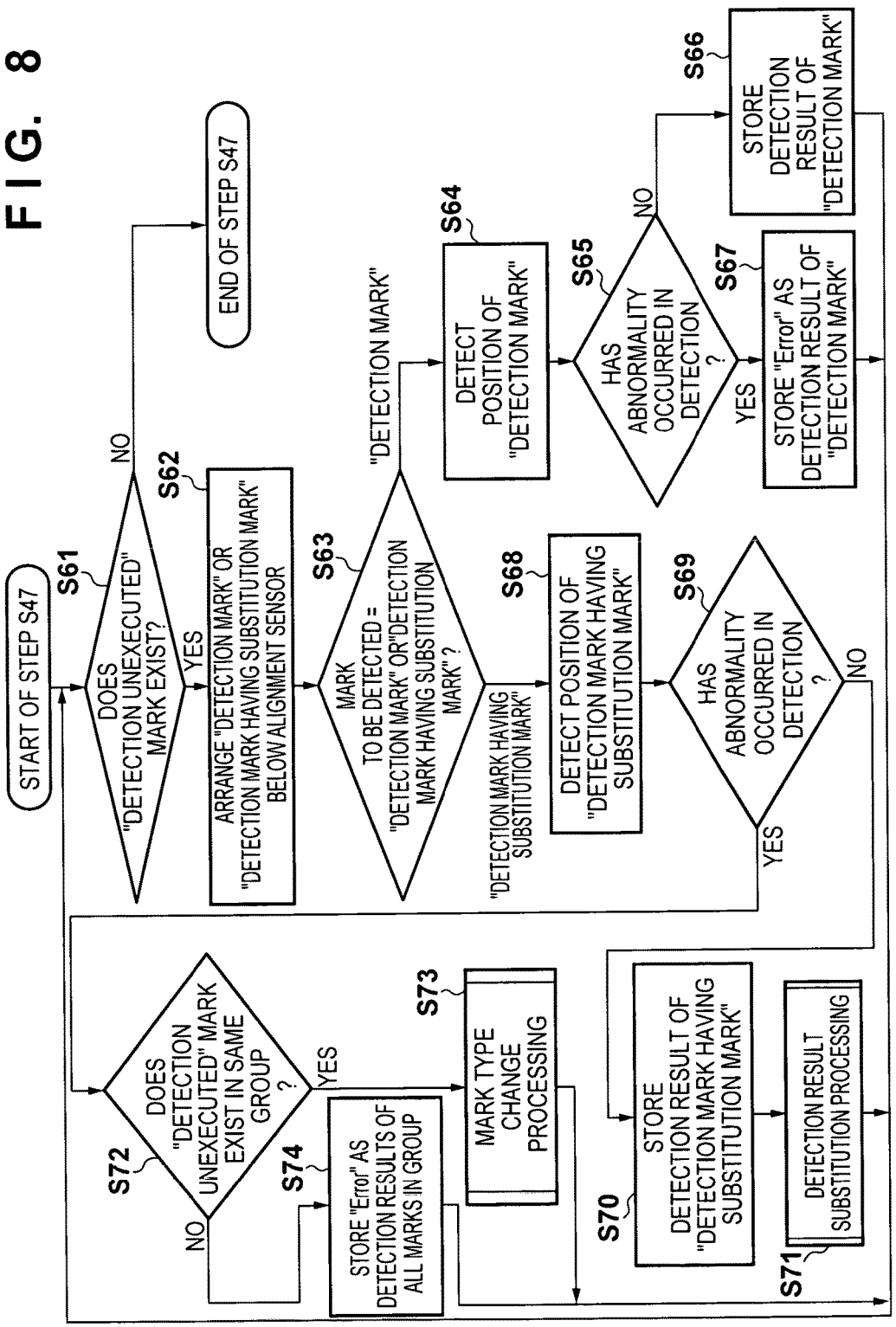

FIG. 11

| | MARK SHAPE | MARK TYPE | GROUP | DETECTION STATE | X POSITION DATA | Y POSITION DATA |
|---|---|---|---|---|---|---|
| $S_1M_1XY$ | XY MARK | DETECTION MARK | | DETECTION EXECUTED | x1 | y1 |
| $S_1M_2X$ | X MARK | SUBSTITUTION MARK | $S_9C$ | DETECTION EXECUTED | x9 | |
| $S_1M_3Y$ | Y MARK | SUBSTITUTION MARK | $S_9C$ | DETECTION EXECUTED | | y2 |
| $S_1M_4XY$ | XY MARK | SUBSTITUTION MARK | $S_8C$ | DETECTION EXECUTED | x8 | y8 |
| $S_2M_1XY$ | XY MARK | DETECTION MARK HAVING SUBSTITUTION MARK | | DETECTION EXECUTED | x2 | y2 |
| $S_2M_2X$ | X MARK | SUBSTITUTION MARK | $S_8C$ | DETECTION EXECUTED | x8 | |
| $S_2M_3Y$ | Y MARK | SUBSTITUTION MARK | $S_3C$ | DETECTION EXECUTED | | y3 |
| $S_2M_4XY$ | XY MARK | SUBSTITUTION MARK | $S_7C$ | DETECTION EXECUTED | x7 | y7 |
| $S_8M_1XY$ | XY MARK | DETECTION MARK HAVING SUBSTITUTION MARK | | DETECTION EXECUTED | x8 | y8 |
| $S_8M_2X$ | X MARK | SUBSTITUTION MARK | $S_{13}C$ | DETECTION EXECUTED | x13 | |
| $S_8M_3Y$ | Y MARK | SUBSTITUTION MARK | $S_7C$ | DETECTION EXECUTED | | y7 |
| $S_8M_4XY$ | XY MARK | SUBSTITUTION MARK | $S_{14}C$ | DETECTION EXECUTED | x14 | y14 |
| $S_9M_1XY$ | XY MARK | DETECTION MARK HAVING SUBSTITUTION MARK | | DETECTION EXECUTED | x9 | y9 |
| $S_9M_2X$ | X MARK | SUBSTITUTION MARK | $S_{12}C$ | DETECTION EXECUTED | x12 | |
| $S_9M_3Y$ | Y MARK | SUBSTITUTION MARK | $S_8C$ | DETECTION EXECUTED | | y8 |
| $S_9M_4XY$ | XY MARK | SUBSTITUTION MARK | $S_{13}C$ | DETECTION EXECUTED | x13 | y13 |

F I G. 16

| | Direction | X(um) | Y(um) |
|---|---|---|---|
| R | 10μm (70) | | |
| Mark1 | XY (71) | 10μm (76) | 15μm (81) |
| Mark2 | X (72) | 10μm (77) | -15μm (82) |
| Mark3 | Y (73) | -10μm (78) | 15μm (83) |
| Mark4 | XY (74) | -10μm (79) | -15μm (84) |

113

METHOD OF OBTAINING POSITION, EXPOSURE METHOD, AND METHOD OF MANUFACTURING ARTICLE

BACKGROUND OF THE INVENTION

Field of the Invention

The present invention relates to a method of obtaining the position of a shot region formed on a substrate, an exposure method, and a method of manufacturing an article.

Description of the Related Art

One of apparatuses used in the manufacturing process (lithography process) of a semiconductor device or the like is an exposure apparatus (lithography apparatus) which transfers the pattern of a mask (original) to a substrate (for example, a wafer or glass substrate) coated with a resist (photoresist). The exposure apparatus needs to transfer the pattern of a mask at high accuracy to each of a plurality of shot regions formed on a substrate. It is important to align the pattern of the mask and each shot region at high accuracy. In the exposure apparatus, the positions of a plurality of marks arranged in each of a plurality of shot regions are detected prior to exposure. Based on the detection result, accurate positions in each of the plurality of shot regions formed on the substrate are measured.

The exposure apparatus also needs to improve the throughput (productivity). In the exposure apparatus, it is therefore important to shorten the time (measurement time) taken to obtain the positions of a plurality of shot regions formed on a substrate. Japanese Patent Laid-Open No. 10-284396 has proposed a method of shortening the measurement time by detecting a plurality of marks on a substrate so as to shorten the moving distance of the substrate, instead of detecting the marks by moving the substrate in each shot region. Japanese Patent Laid-Open No. 2001-223150 has proposed a method of, when detecting the position of a mark arranged in a shot region on a substrate, shortening the measurement time by applying a focus value used when the position of a mark on another substrate was detected.

In the method disclosed in Japanese Patent Laid-Open No. 10-284396, a plurality of marks on a substrate are merely detected to shorten the moving distance of the substrate. Thus, the measurement time can be shortened by only a decrease in the moving distance of the substrate. Japanese Patent Laid-Open No. 2001-223150 does not disclose a method of, when obtaining the position of a target shot region, applying the position of a mark arranged in a shot region formed next to the target shot region on the same substrate.

SUMMARY OF THE INVENTION

The present invention provides a technique advantageous for, for example, shortening the time taken to obtain the position of a shot region formed on a substrate, that is, improving the throughput.

According to one aspect of the present invention, there is provided a method of obtaining a position of a second shot region next to a first shot region, out of a plurality of shot regions formed on a substrate, comprising: a first detection step of detecting a position of a first mark arranged in the first shot region; a second detection step of detecting a position of a mark more distant from the first mark, out of a second mark and a third mark arranged in the second shot region; and a determination step of determining the position of the second shot region based on a detection result in the first detection step and a detection result in the second detection step.

Further features of the present invention will become apparent from the following description of exemplary embodiments with reference to the attached drawings.

BRIEF DESCRIPTION OF THE DRAWINGS

FIG. 5 is a view showing a screen displayed on the I/O interface of a control unit;

FIG. 7 is a view showing an example of information of each mark;

FIG. 8 is a flowchart showing processing of obtaining position data of each mark;

FIG. 11 is a view showing an example of information of each mark;

FIG. 16 is a view showing a screen displayed on the I/O interface of the control unit;

DESCRIPTION OF THE EMBODIMENTS

Figure 1:
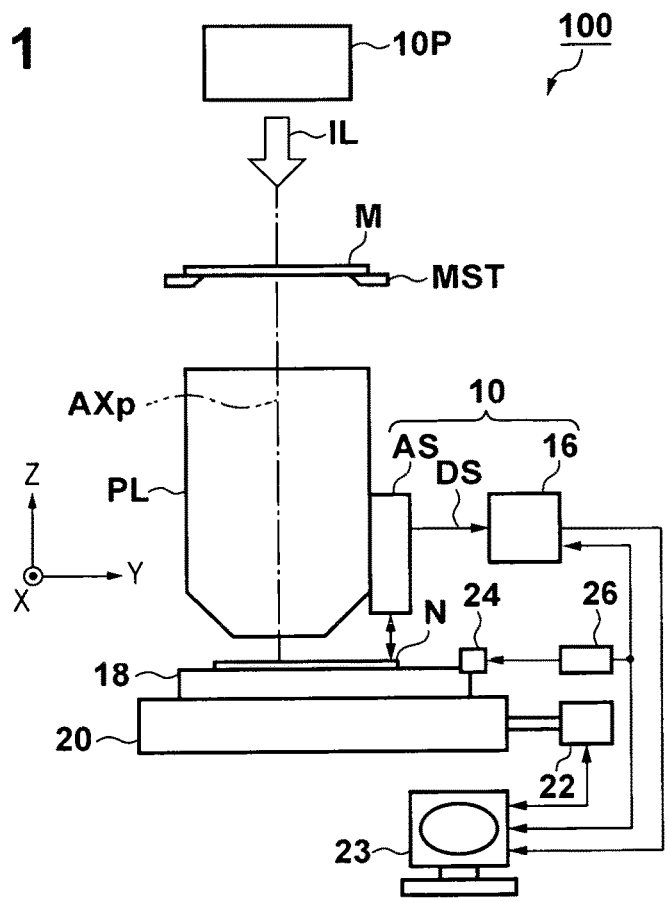
FIG. 1 is a schematic view showing an exposure apparatus.

Exemplary embodiments of the present invention will be described below with reference to the accompanying drawings. Note that the same reference numerals denote the same members throughout the drawings, and a repetitive description thereof will not be given. In each embodiment, the first and second directions perpendicular to each other on a plane parallel to the surface of a substrate will be explained as the X and Y directions, respectively, and a direction perpendicular to the surface of the substrate will be explained as the Z direction.

First Embodiment

An exposure apparatus 100 for practicing a measurement method of measuring a position in a shot region formed on a substrate, that is, a method of obtaining the position of a shot region will be described with reference to FIG. 1. FIG. 1 is a schematic view showing the exposure apparatus 100. The exposure apparatus 100 shown in FIG. 1 is, for example, a step & repeat reduction projection exposure apparatus (so-called stepper). Note that the exposure apparatus can include a proximity type, mirror projection type, and step & scan type, in addition to the step & repeat type. Further, the present invention is applicable to even an EUV exposure apparatus, a charged particle beam drawing apparatus, an imprint apparatus, and a pattern forming apparatus using the DSA action.

The exposure apparatus 100 includes an illumination system IOP, a mask stage MST which holds a mask M, and a projection optical system PL which projects, to a resist-coated substrate W, the image of a pattern formed on the mask M. The exposure apparatus 100 also includes a substrate stage 20 capable of moving while holding the substrate W, a driving unit 22 which drives the substrate stage 20, a detection unit 10 which detects a mark (alignment mark) formed on the substrate, and a control unit 28. The control unit 28 is constituted by a computer including, for example, a CPU, memory, and I/O interface, and controls the respective units of the exposure apparatus 100.

The illumination system IOP includes, for example, a light source, fly-eye lens, and condenser lens. The illumination system IOP illuminates the pattern of the mask M by illumination light IL emitted by the light source with a uniform illuminance distribution. As the light source, for example, a mercury lamp which emits an emission line such as an i-ray as the illumination light IL, or an excimer laser such as a KrF laser or ArF laser which emits a laser beam of a short wavelength as the illumination light IL is used.

The mask stage MST is configured to hold the mask M by vacuum chucking or the like, and be movable in the X direction, Y direction, and θ direction (rotational direction around the Z-axis). The mask stage MST can position the mask M so that the center of the pattern of the mask M almost coincides with an optical axis AXp of the projection optical system PL.

The projection optical system PL is, for example, a both side telecentric optical system, and is configured to have a predetermined reduction magnification β (for example, β is ⅕). When the mask M is illuminated by the illumination light IL at a uniform illuminance while the pattern of the mask M and a shot region on the substrate W are aligned with each other, the pattern of the mask M is reduced at the reduction magnification β by the projection optical system PL, and projected on the substrate.

The substrate stage 20 is configured to support a substrate table 18 which holds the substrate W by vacuum chucking or the like, and to be movable in the X and Y directions. The substrate table 18 has a function of, for example, driving the substrate W in the Z direction. The substrate table 18 can adjust a position of the substrate W in the Z direction so that the substrate surface coincides with the imaging plane (focus plane) of the projection optical system. The exposure apparatus 100 also includes a measurement unit 26 which measures positions of the substrate table 18 in the X and Y directions. The measurement unit 26 can include, for example, a laser interferometer. For example, the laser interferometer emits a laser beam toward a reflecting plate 24 of the substrate table 18, and detects a displacement of the substrate table 18 from a reference position based on the laser beam reflected by the reflecting plate 24. Based on the displacement, the measurement unit 26 can measure the current position of the substrate table 18. Information (measurement value of the measurement unit 26) of the current position of the substrate table 18 that is measured by the measurement unit 26 is supplied to the control unit 28. While monitoring the measurement value of the measurement unit 26, the control unit 28 controls the driving unit 22 to arrange the substrate W at a target position, and positions the substrate W. In the exposure apparatus 100 according to the first embodiment, the measurement unit 26 is configured to measure a position of the substrate table 18 in the X direction. In practice, the measurement unit 26 can be configured to measure even a position of the substrate table 18 in the Y direction. In the following description, a coordinate system at rest defined by the measurement unit 26 will be called a stage coordinate system.

The detection unit 10 can include an alignment sensor AS of an off-axis method that is arranged on the side surface of the projection optical system PL and detects a mark formed on a substrate, and an alignment control unit 16 which controls the alignment sensor AS. As the alignment sensor AS, for example, an imaging alignment sensor of an image processing method is used. An example of the arrangement of the alignment sensor AS will be described with reference to FIG. 2.

Figure 2:
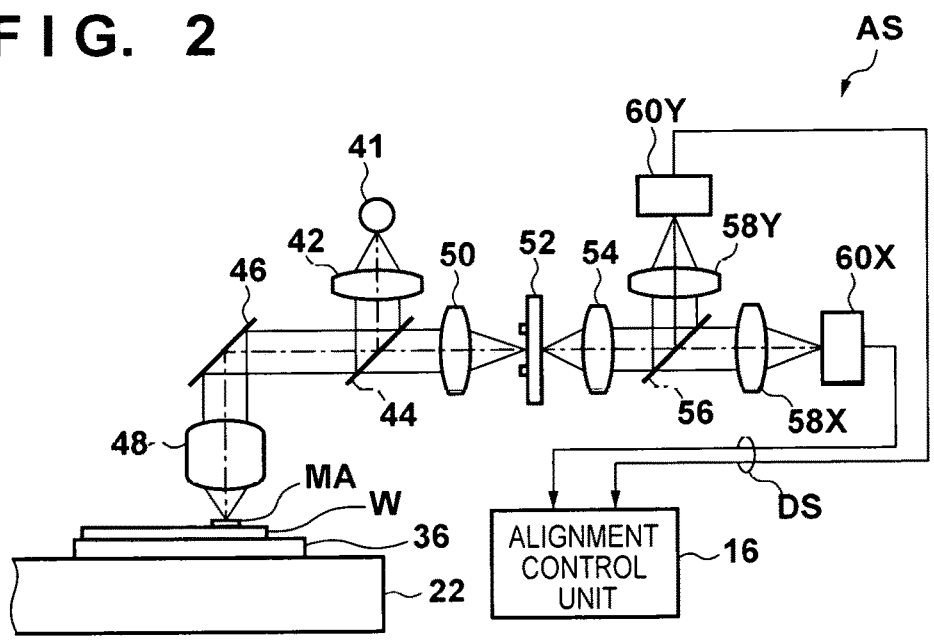
FIG. 2 is a view showing an example of the arrangement of an alignment sensor.

FIG. 2 is a view showing an example of the arrangement of the alignment sensor AS. The alignment sensor AS includes, for example, a light source 41, collimator lens 42, beam splitter 44, mirror 46, objective lens 48, condenser lens 50, and index plate 52. The alignment sensor AS further includes, for example, a first relay lens 54, beam splitter 56, X-axis second relay lens 58x, X-axis image sensor 60x, Y-axis second relay lens 58y, and Y-axis image sensor 60y.

As the light source 41, a light source (for example, halogen lamp) configured to emit light to which a resist applied on a substrate is not photosensitive, and which has a broad wavelength distribution of a given bandwidth (for example, about 200 nm) is used. This light is used to prevent a decrease in mark detection accuracy caused by thin-film interference on a resist layer. Light emitted by the light source 41 irradiates a mark MA on the substrate through the collimator lens 42, beam splitter 44, mirror 46, and objective lens 48. The light reflected by the mark MA irradiates the index plate 52 through the objective lens 48, mirror 46, beam splitter 44, and condenser lens 50. As a result, the image of the mark MA is formed on the index plate 52.

The light having passed through the index plate 52 travels toward the beam splitter 56 through the first relay lens 54. Light having passed through the beam splitter 56 is condensed on the image sensing surface of the X-axis image sensor 60x through the X-axis second relay lens 58x. Light reflected by the beam splitter 56 is condensed on the image sensing surface of the Y-axis image sensor 60y through the Y-axis second relay lens 58y. The image of the mark MA and the image of the index mark of the index plate 52 are superimposed and formed on each of the image sensing surfaces of the image sensors 60x and 60y. Image sensing signals DS from the image sensors 60x and 60y are supplied to the alignment control unit 16 together with the measurement value of the measurement unit 26. The alignment control unit 16 includes an image processing circuit and CPU. The alignment control unit 16 can determine the position of the mark MA in the stage coordinate system based on the image sensing signals DS from the alignment sensor AS, and the measurement value of the measurement unit 26.

In general, an exposure apparatus needs to transfer the pattern of a mask at high accuracy to each of a plurality of shot regions formed on a substrate. It is important to align each of a plurality of shot regions and the pattern of the mask at high accuracy. For this purpose, it is becoming popular to employ a die-by-die alignment method in the exposure apparatus. The die-by-die alignment method is a method of aligning a shot region and the pattern of a mask for each shot region on a substrate. In an exposure apparatus adopting the die-by-die alignment method, an accurate position in each of a plurality of shot regions is measured prior to exposure of a substrate. For example, the exposure apparatus detects each of the positions of a plurality of marks arranged in a target shot region to be exposed, out of a plurality of shot regions. Based on the detection result of the position of each mark, the exposure apparatus determines the position of the target shot region.

Also, the exposure apparatus needs to improve the throughput (productivity). In the exposure apparatus adopting the die-by-die alignment method, it is important to shorten the measurement time taken to measure the position of each shot region. Hence, the exposure apparatus 100 according to the first embodiment obtains position data of each mark without detecting, by the detection unit 10, all marks arranged in each of a plurality of shot regions. That is, the exposure apparatus 100 improves the throughput by decreasing the number of marks to be detected by the detection unit 10 when measuring the position of each shot region.

For example, assume that the position of the second shot region next to the first shot region, out of a plurality of shot regions formed on a substrate, is obtained. In this case, the position of the first mark arranged in the first shot region has already been detected by the detection unit 10 and known. At this time, in the exposure apparatus 100, the detection unit 10 detects the position of a mark more distant from the first mark, out of the second and third marks arranged in the second shot region next to the first shot region. The position of the second shot region is determined based on the positions of the "first mark" and "distant mark" detected by the detection unit 10. That is, in the exposure apparatus 100, the detection result of the position of the first mark arranged in the first shot region is substituted for the position of a "close mark" without detecting, by the detection unit 10, the position of a mark closer to the first mark, out of the second and third marks arranged in the second shot region. In this manner, the position of the second shot region is determined based on the "first mark" in the first shot region and the "distant mark" in the second shot region. While maintaining the measurement accuracy of the position of the second shot region, the number of marks to be detected by the detection unit 10 can be decreased. Thus, the measurement time can be shortened to improve the throughput.

In the first embodiment, the detection result of the position of a mark arranged in a shot region next to a target shot region is obtained instead of the position of at least one mark, out of a plurality of marks arranged in the target shot region. In the first embodiment, the position of the target shot region, out of a plurality of shot regions, is determined based on the positions (actually detected position data and position data obtained as a substitution) of marks arranged in the target shot region. Especially, the method according to the first embodiment is the die-by-die alignment method, which is different from a global alignment method of detecting the position of a sample shot region selected from a plurality of shot regions on a substrate, and obtaining the position of a target shot region based on the result. By the method according to the first embodiment, the position of a target shot region can be obtained at higher accuracy than by the global alignment method.

Figure 3:
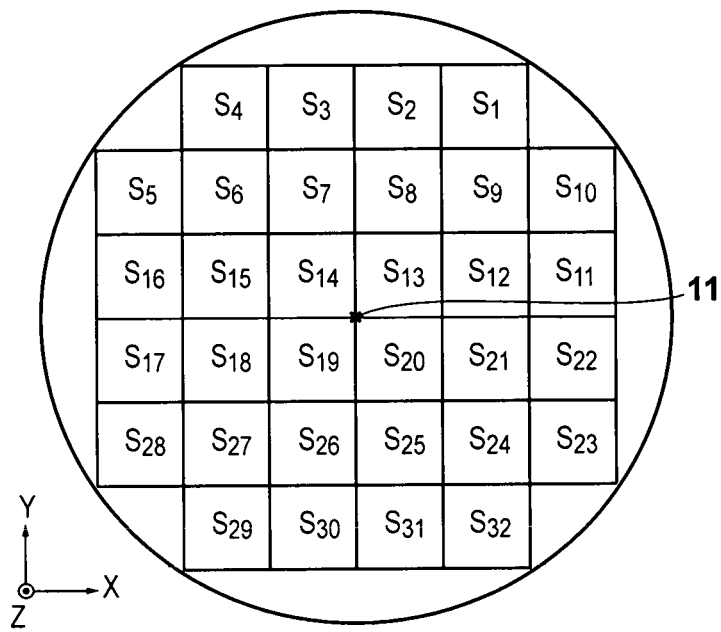
FIG. 3 is a view showing the layout of a plurality of shot regions formed on a substrate.
Figure 4:
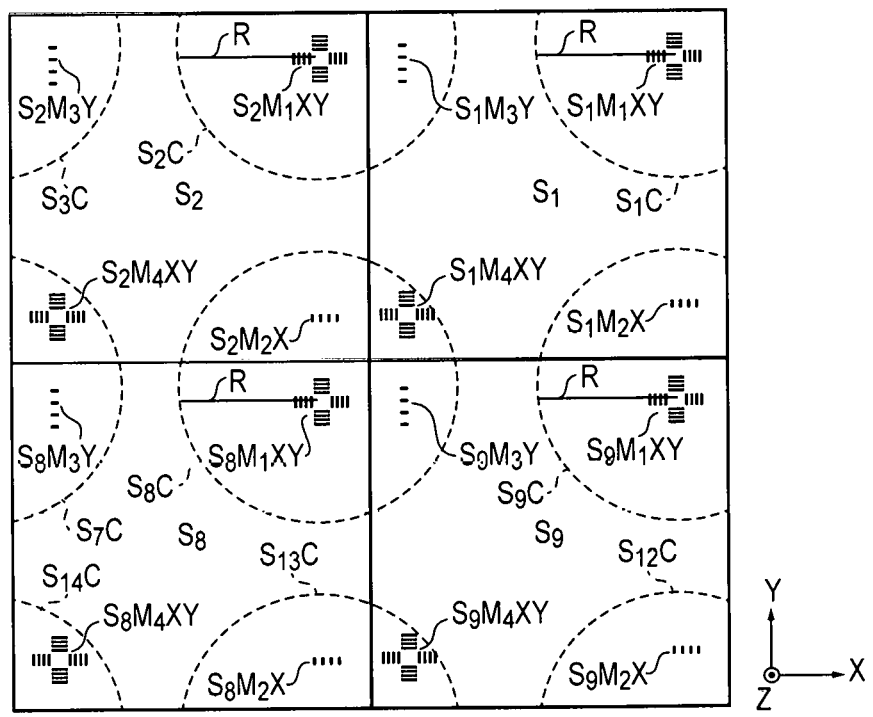
FIG. 4 is an enlarged view showing four next shot regions.

As the first embodiment, an example of a method of obtaining the position of a shot region formed on a substrate by the die-by-die alignment method will be explained. The first embodiment assumes that 32 shot regions are formed on a substrate, as shown in FIG. 3. FIG. 3 is a view showing the layout of a plurality (32) of shot regions formed on a substrate. Also, the first embodiment assumes that the dimensions of one shot region are 30 μm (X direction)×40 μm (Y direction), and four marks Mark1 to Mark4 are arranged in one shot region, as shown in FIG. 4. FIG. 4 is an enlarged view showing four next shot regions $S_1$, $S_2$, $S_8$, and $S_9$, out of the plurality (32) of shot regions formed on a substrate. The relationship in which shot regions are next to each other includes not only the relationship between two shot regions next to each other in the X or Y direction, but also the relationship between two shot regions obliquely next to each other on the X-Y plane, such as the relationship between the shot regions $S_1$ and $S_8$. That is, the relationship in which shot regions are next to each other includes even the relationship between a given shot region, and a shot region arranged to be next in the Y direction to a shot region arranged to be next in the X direction to the given shot region.

First, as an initial stage, information of marks arranged in one shot region, conditions in detecting marks by the detection unit 10, and the like are set. The setting may be made manually by the user, or automatically by the control unit 28 based on design data. FIG. 5 shows a screen 90 which is displayed on the I/O interface of the control unit 28 when setting information of marks arranged in one shot region, conditions in detecting marks by the detection unit 10, and the like.

In the screen 90 shown in FIG. 5, "R" is an item for setting a radius, that is, a predetermined distance (to be referred to as a distance R hereinafter) of a specified range for sorting each mark into a group. The distance R is set in accordance with the dimensions (shot size) of one shot region. For example, the distance R can be set to be equal to or smaller than half the length of the short side of one shot region, or be equal to or smaller than the distance (equal to or smaller than the interval) between two marks arranged in one shot region. In an "R" field 70 shown in FIG. 5, 15 μm is input. In the screen 90 shown in FIG. 5, "Direction" is an item for setting the direction of a position detectable by each mark. In the first embodiment, marks are classified into, for example, three types of shapes "XY mark", "X mark", and "Y mark". The XY mark is configured to be able to detect positions in the X direction (first direction) and the Y direction (second direction) perpendicular to each other on a plane parallel to the surface of the substrate W. The X mark is configured to be able to detect only a position in the X direction. The Y mark is configured to be able to detect only a position in the Y direction. In "Direction" fields 71 to 74 for Mark1 to Mark4 shown in FIG. 5, "XY" representing that the mark is an XY mark, "X" representing that the mark is an X mark, and "Y" representing that the mark is a Y mark are input, respectively.

In the screen 90 shown in FIG. 5, "X (v)" and "Y (μm)" are items for setting distances of each mark in the X and Y directions from the center of a shot region, respectively. In "X (μm)" fields 76 to 79 for Mark1 to Mark4 shown in FIG.

5, the distance of each mark in the X direction from the center of a shot region is input. In "Y (μm)" fields 81 to 84, the distance of each mark in the Y direction from the center of a shot region is input. In the screen 90 shown in FIG. 5, "Center" is an item for setting, as a representative mark, one of a plurality of marks arranged in one shot region. "Center" fields 87 to 89 for Mark2 to Mark4 shown in FIG. 5 are not checked, and only a field 86 for Mark1 is checked. That is, Mark1 is set as the representative mark.

Figure 6:
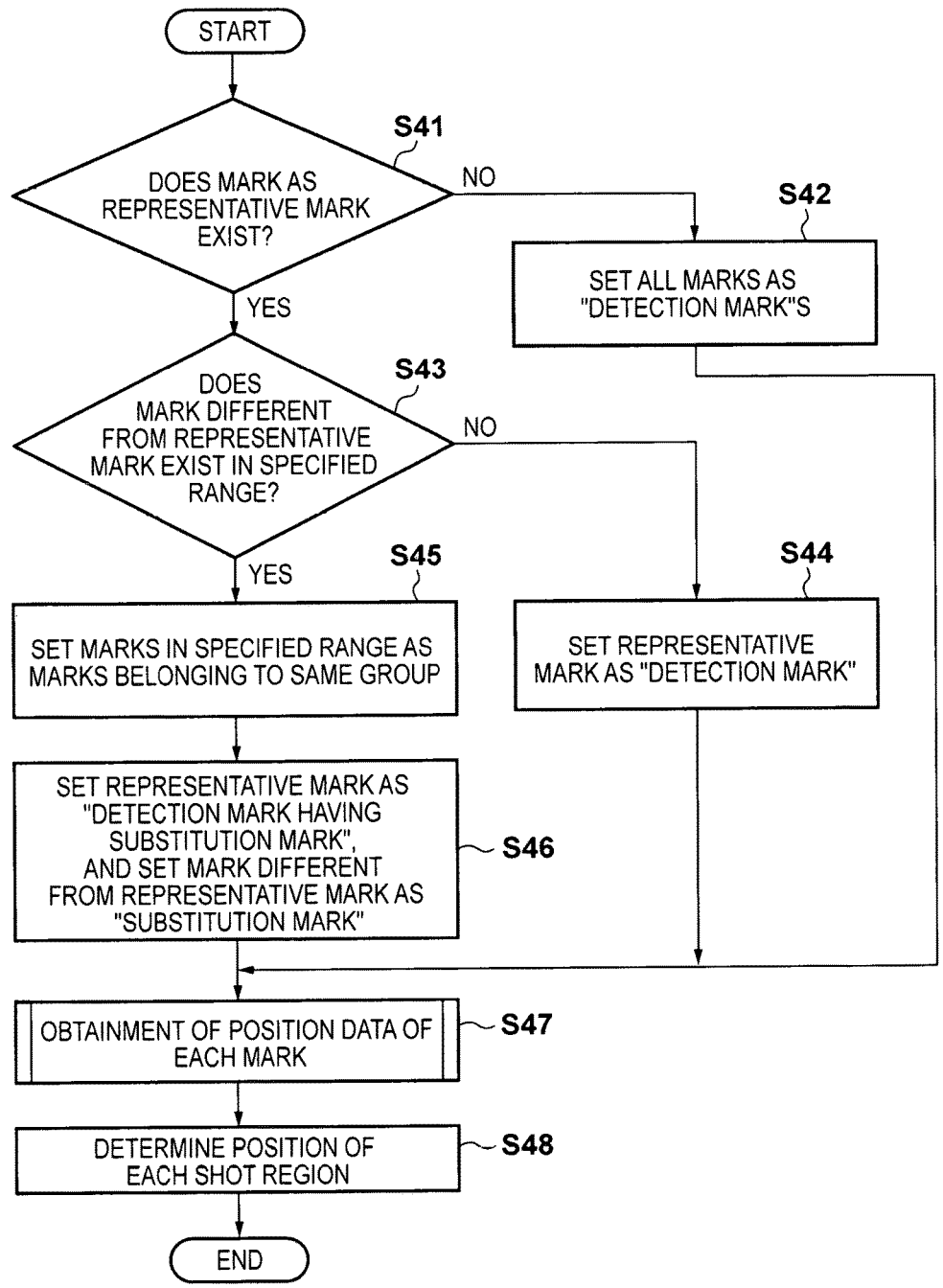
FIG. 6 is a flowchart showing a measurement method of measuring the position of each shot region.

Next, an example of a measurement method of measuring the position of each of a plurality of shot regions formed on a substrate will be explained with reference to FIG. 6. FIG. 6 is a flowchart showing the measurement method of measuring the position of each shot region. The control unit 28 can execute the processes of the flowchart shown in FIG. 6.

In step S41, the control unit 28 determines whether a mark set as a representative mark exists among four marks in one shot region. That is, the control unit 28 determines whether there is a mark for which the "Center" field shown in FIG. 5 is checked. If no mark is set as a representative mark, the process advances to step S42, and the control unit 28 sets all marks in each shot region as "detection mark"s whose positions are detected by the detection unit 10. If there is a mark set as a representative mark, the process advances to step S43, and the control unit 28 determines whether a mark different from the representative mark exists in a range (specified range) having the distance R (predetermined distance) or smaller from the representative mark (reference point) serving as the center. If a mark different from the representative mark does not exist in the specified range, the process advances to step S44, and the control unit 28 sets the representative mark as a "detection mark". If a mark different from the representative mark exists in the specified range, the process advances to step S45, and the control unit 28 sets the marks (including the representative mark) in the specified range as marks belonging to the same group.

In step S46, the control unit 28 sets, as a "substitution mark", the mark different from the representative mark in the specified range, and sets the representative mark as a "detection mark having a substitution mark". The "substitution mark" is a mark whose position is not detected by the detection unit 10, and position data is obtained using the detection result of a mark whose position has been detected by the detection unit 10, out of marks contained in the specified range. In the first embodiment, the detection result of a mark whose position has been detected by the detection unit 10, out of marks contained in the specified range, is directly input as position data of the "substitution mark". The "detection mark having a substitution mark" is a mark whose position has been detected by the detection unit 10, and whose detection result is used as position data of the "substitution mark" contained in the specified range.

For example, in the screen 90 shown in FIG. 5, the mark Mark1 arranged at the upper right portion of a shot region is set as a representative mark. As represented by broken lines in FIG. 4, ranges having the distance R or smaller from, as centers, marks $S_1M_1XY$, $S_2M_1XY$, $S_8M_1XY$, and $S_9M_1XY$ arranged at the upper right portions of the respective shot regions $S_1$, $S_2$, $S_8$, and $S_9$ are set as specified ranges. Some specified ranges set in this fashion contain a mark different from a representative mark, and others do not. For example, a range $S_1C$ having the mark $S_1M_1XY$ of the shot region $S_1$ as the center does not contain a mark different from the representative mark (mark $S_1M_1XY$). In step S44, the mark $S_1M_1XY$ is set as a "detection mark".

In contrast, a range $S_2C$ having the mark $S_2M_1XY$ of the shot region $S_2$ as the center contains a mark $S_1M_3Y$ different from the representative mark (mark $S_2M_1XY$). In step S45, the mark $S_2M_1XY$ and mark $S_1M_3Y$ are set as marks belonging to the same group. Then, the mark $S_2M_1XY$ is set as a "detection mark having a substitution mark" in step S46, and the mark $S_1M_3Y$ is set as a "substitution mark" in step S46. Similarly, a range $S_8C$ having the mark $S_8M_1XY$ of the shot region $S_8$ as the center, and a range $S_9C$ having the mark $S_9M_1XY$ of the shot region $S_9$ as the center contain marks different from the representative marks. In step S45, the marks $S_8M_1XY$, $S_1M_4XY$, $S_2M_2X$, and $S_9M_3Y$ contained in the range $S_8C$ are set as marks belonging to the same group. In step S45, the marks $S_9M_1XY$ and $S_1M_2X$ contained in the range $S_9C$ are set as marks belonging to the same group. Each of the representative marks $S_8M_1XY$ and $S_9M_1XY$ in the respective ranges $S_8C$ and $S_9C$ is set as a "detection mark having a substitution mark" in step S46, and the remaining marks are set as "substitution mark"s in step S46.

FIG. 7 is a view showing an example of information 97 of each mark when the control unit 28 performs the processes of steps S41 to S46. The information 97 is stored in the control unit 28 and can be displayed on the I/O interface. As shown in FIG. 7, the information 97 of each mark includes, for example, a mark shape 91, mark type 92, group 93, detection state 94, X position data 95, and Y position data 96. In the information 97, the mark shape 91 is an item representing one of an "XY mark", "X mark", and "Y mark" as a mark. The mark type 92 is an item representing one of a "detection mark", "substitution mark", and "detection mark having a substitution mark" as a mark. The group 93 is an item representing a group to which a mark belongs. The detection state 94 is an item representing the state of detection of a mark. The X position data 95 is an item representing position data in the X direction. The Y position data 96 is an item representing position data in the Y direction.

In step S47, the control unit 28 obtains position data of each mark based on information of each mark shown in FIG. 7, which will be described later. In step S48, the control unit 28 determines the position (shift amounts in the X and Y directions) of each shot region in the stage coordinate system based on the position data of each mark. In step S48, the control unit 28 can also determine, for example, the rotation error and shape error (for example, magnification error and distortion error) of each shot region with respect to a target shot region (shot region serving as a reference in design) based on the position data of each mark.

The processing of obtaining position data of each mark in step S47 will be explained with reference to FIG. 8. FIG. 8 is a flowchart showing the processing of obtaining position data of each mark. The control unit 28 can execute the processes of the flowchart shown in FIG. 8.

In step S61, the control unit 28 determines whether a "detection unexecuted" mark representing a state in which the mark does not have position data exists in information of each mark shown in FIG. 7. If no "detection unexecuted" mark exists, the process advances to step S48 of FIG. 6, and the control unit 28 determines the position of each shot region based on position data of each mark. If a "detection unexecuted" mark exists, the process advances to step S62. In step S62, the control unit 28 controls the substrate stage 20 to move the substrate W so that a mark set as a "detection mark" or "detection mark having a substitution mark" is arranged below the alignment sensor AS of the detection unit 10. At this time, the control unit 28 may select a mark to be arranged below the alignment sensor AS, so as to shorten the moving distance of the substrate W.

In step S63, the control unit 28 determines which of the "detection mark" and "detection mark having a substitution mark" is set as the mark whose position is detected by the detection unit 10. If the "detection mark" is set as the mark whose position is detected by the detection unit 10, the process advances to step S64, and the control unit 28 controls the detection unit 10 to detect the position of the mark. In step S65, the control unit 28 determines whether an abnormality has occurred when the position of the mark is detected in step S64 (whether the position of the mark has been detected normally). The abnormality occurs in a case where the detection unit 10 has not correctly detected the image of a mark, for example, in a case where the mark is not correctly arranged below the alignment sensor AS, or in a case where the substrate surface is not arranged on the focus plane of the projection optical system PL. The abnormality may also occur in a case where a mark is chipped or crushed in the semiconductor manufacturing process. If no abnormality has occurred in detection of the mark, the process advances to step S66, and the control unit 28 stores the detection results (position data in the X direction and position data in the Y direction) of the detection unit 10 for the mark having undergone detection in step S64. The control unit 28 changes "detection unexecuted" to "detection executed" for the mark, and executes step S61 again. If an abnormality has occurred in detection of the mark, the process advances to step S67, and the control unit 28 stores, for the mark having undergone detection in step S64, "Error" representing that the abnormality has occurred in detection. Further, the control unit 28 changes "detection unexecuted" to "detection executed" for the mark, and executes step S61 again.

If the "detection mark having a substitution mark" is set as the mark whose position is detected by the detection unit 10 in step S63, the process advances to step S68, and the control unit 28 controls the detection unit 10 to detect the position of the mark. In step S69, the control unit 28 determines whether an abnormality has occurred when the position of the mark is detected in step S68. If no abnormality has occurred in detection of the mark, the process advances to step S70, and the control unit 28 stores the detection results (position data in the X direction and position data in the Y direction) of the detection unit 10 for the mark having undergone detection in step S68. The control unit 28 changes "detection unexecuted" to "detection executed" for the mark. In step S71, the control unit 28 performs processing of inputting the detection result of the mark having undergone detection in step S68, as position data of a "substitution mark" belonging to the same group as that of the mark. Details of the processing in step S71 will be described later. After performing the processing in step S71, the control unit 28 executes step S61 again.

If an abnormality has occurred in detection of the mark, the process advances to step S72, and the control unit 28 determines whether a "detection unexecuted" mark exists in the same group as that of the mark which was the detection target in step S68. If a "detection unexecuted" mark exists, the process advances to step S73, and the control unit 28 performs processing of setting, as a "detection mark having a substitution mark", a mark other than the mark which was the detection target in step S68. Details of the processing in step S73 will be described later. After performing the processing in step S73, the control unit 28 executes step S61 again. If a "detection unexecuted" mark does not exist in step S72, the process advances to step S74, and the control unit 28 stores "Error" for the mark which was the detection target in step S68, and a mark belonging to the same group as that of the mark. The control unit 28 changes "detection unexecuted" to "detection executed" for these marks, and executes step S61 again.

Figure 9:
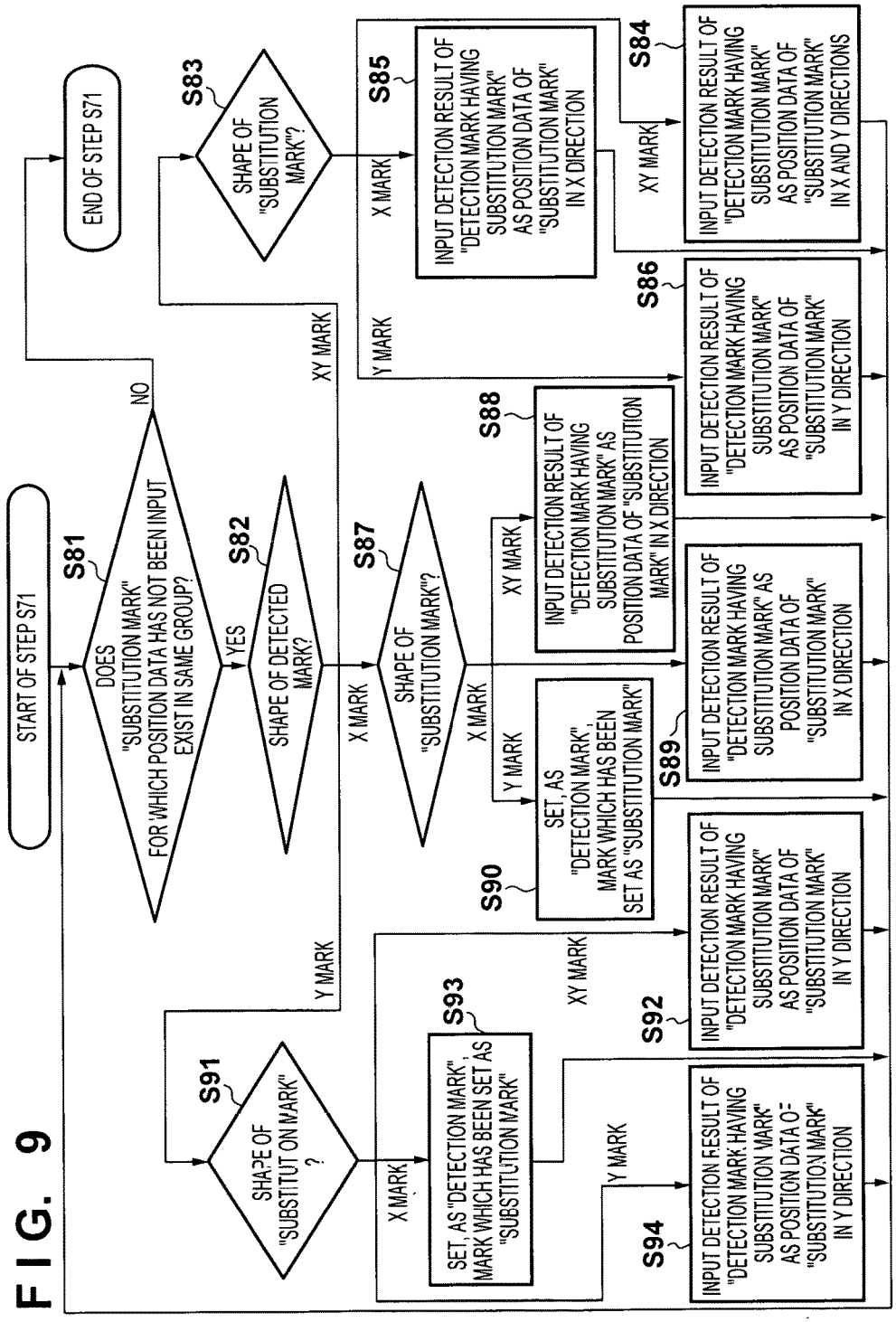
FIG. 9 is a flowchart showing processing of inputting, as position data of a "substitution mark", the detection result of a mark whose position has been detected.

The processing in step S71 will be described with reference to FIG. 9. FIG. 9 is a flowchart showing the processing of inputting the detection result of a mark having undergone detection in step S68, as position data of a "substitution mark" belonging to the same group as that of the mark. The control unit 28 can execute the processes of the flowchart shown in FIG. 9.

In step S81, the control unit 28 determines whether a "substitution mark" for which the detection result of a "detection mark having a substitution mark" has not been input as position data exists in the same group as that of the "detection mark having a substitution mark" whose position has been detected in step S68 of FIG. 8. If there is not a "substitution mark" for which the detection result of the "detection mark having a substitution mark" has not been input, the process advances to step S61 of FIG. 8, and the control unit 28 determines whether there is a "detection unexecuted" mark in information of each mark. If there is a "substitution mark" for which the detection result of the "detection mark having a substitution mark" has not been input, the process advances to step S82, and the control unit 28 determines a mark shape in the "detection mark having a substitution mark" whose position has been detected in step S68.

If the mark shape in the "detection mark having a substitution mark" is an "XY mark" in step S82, the process advances to step S83. In step S83, the control unit 28 determines a mark shape in the "substitution mark" for which the detection result of the "detection mark having a substitution mark" is input. If the shape of the "substitution mark" is an "XY mark", the process advances to step S84, and the control unit 28 inputs the detection results of the "detection mark having a substitution mark" as position data of the "substitution mark" in the X and Y directions. If the mark shape in the "substitution mark" is an "X mark", the process advances to step S85, and the control unit 28 inputs the detection result of the "detection mark having a substitution mark" as position data of the "substitution mark" in the X direction. Similarly, if the mark shape in the "substitution mark" is a "Y mark", the process advances to step S86, and the control unit 28 inputs the detection result of the "detection mark having a substitution mark" as position data of the "substitution mark" in the Y direction. After the end of step S84, S85, or S86, the control unit 28 changes "detection unexecuted" to "detection executed" for the "substitution mark", and executes step S81 again.

If the mark shape in the "detection mark having a substitution mark" is an "X mark" in step S82, the process advances to step S87, and the control unit 28 determines a mark shape in the "substitution mark" for which the detection result of the "detection mark having a substitution mark" is input. If the mark shape in the "substitution mark" is an "XY mark", the process advances to step S88, and the control unit 28 inputs the detection result of the "detection mark having a substitution mark" as position data of the "substitution mark" in the X direction. If the mark shape in the "substitution mark" is an "X mark", the process advances to step S89, and the control unit 28 inputs the detection result of the "detection mark having a substitution mark" as position data of the "substitution mark" in the X direction. After the end of step S88 or S89, the control unit 28 changes "detection unexecuted" to "detection executed" for the "substitution mark", and executes step S81 again. If the mark shape in the "substitution mark" is a "Y mark", the process advances to step S90. In this case, the mark shape in the "detection mark having a substitution mark" is an "X mark", and the mark shape in the "substitution mark" is a "Y mark". Thus, input of the detection result (position data in the X direction) of the "detection mark having a substitution mark" as position data of the "substitution mark" serving as the "Y mark" in the Y direction may conflict with the intention of the pattern designer. Hence, in step S90, the control unit 28 sets, as a "detection mark", the mark which has been set as the "substitution mark". Accordingly, the position of this mark can be detected in step S64 of FIG. 8.

If the mark shape in the "detection mark having a substitution mark" is a "Y mark" in step S82, the process advances to step S91, and the control unit 28 determines a mark shape in the "substitution mark" for which the detection result of the "detection mark having a substitution mark" is input. If the mark shape in the "substitution mark" is an "XY mark", the process advances to step S92, and the control unit 28 inputs the detection result of the "detection mark having a substitution mark" as position data of the "substitution mark" in the Y direction. If the mark shape in the "substitution mark" is a "Y mark", the process advances to step S94, and the control unit 28 inputs the detection result of the "detection mark having a substitution mark" as position data of the "substitution mark" in the Y direction. After the end of step S92 or S94, the control unit 28 changes "detection unexecuted" to "detection executed" for the "substitution mark", and executes step S81 again. If the mark shape in the "substitution mark" is an "X mark", the process advances to step S93. In this case, in step S93, as in step S90, the control unit 28 sets, as a "detection mark", the mark which has been set as the "substitution mark". The position of this mark can therefore be detected in step S64 of FIG. 8.

Figure 10:
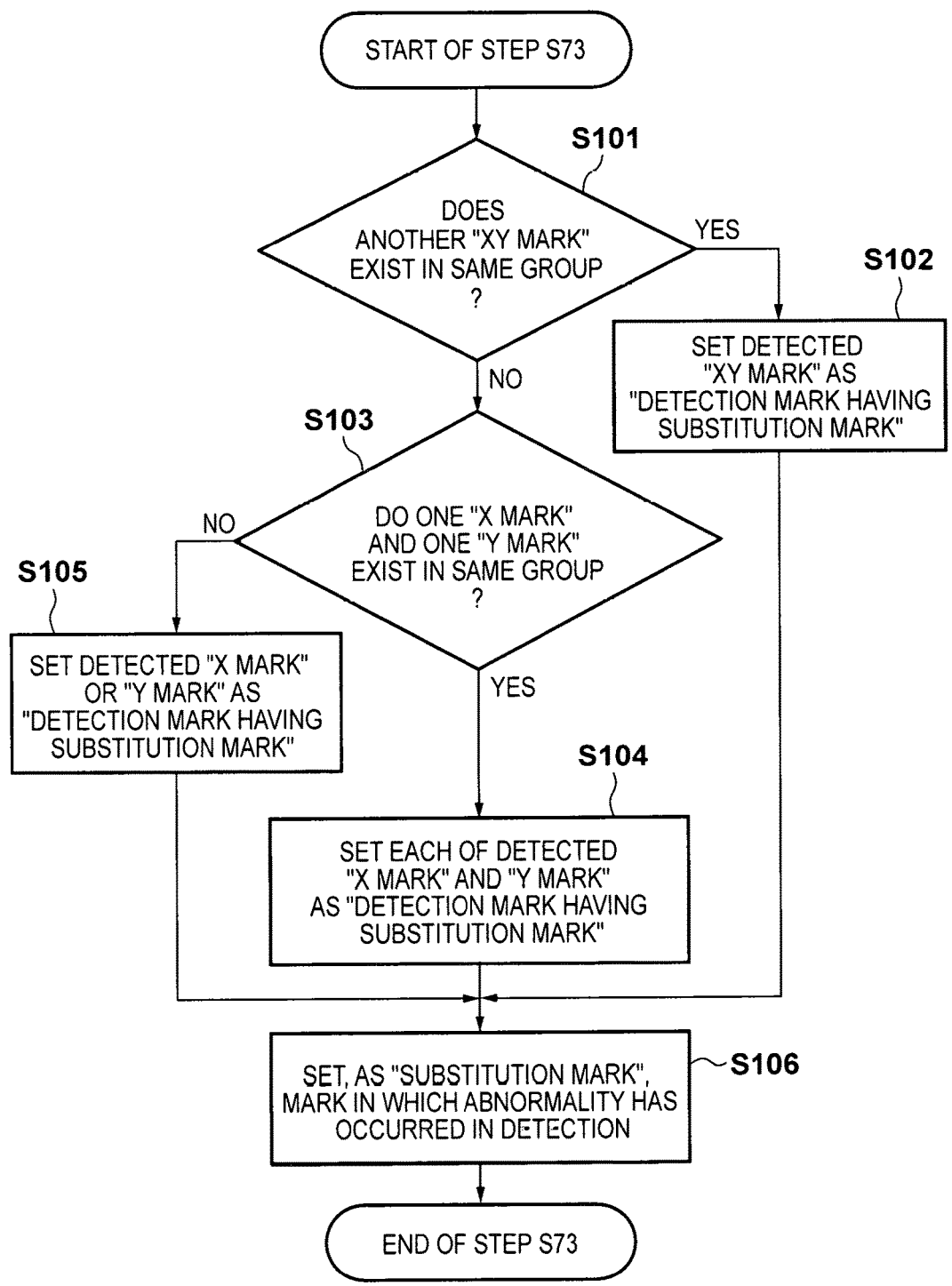
FIG. 10 is a flowchart showing processing of setting, as a "detection mark having a substitution mark", a mark other than the mark whose position has been detected.

The processing in step S73 will be described with reference to FIG. 10. FIG. 10 is a flowchart showing the processing of setting, as a "detection mark having a substitution mark", a mark other than the mark which was the detection target in step S68. The control unit 28 can execute the processes of the flowchart shown in FIG. 10.

In step S101, the control unit 28 determines whether an "XY mark", other than a mark which was the detection target in step S68 (mark for which an abnormality has occurred in detection), exists in the same group as that of the mark. More specifically, the control unit 28 sequentially detects the positions of a plurality of marks until a position is detected in at least one of a plurality of marks in a group (specified range). At this time, the position of an "XY mark" is preferentially detected. If an "XY mark" exists, the process advances to step S102, and the control unit 28 sets the "XY mark" as a "detection mark having a substitution mark". If a plurality of "XY mark"s are detected in step S101, an "XY mark" closest to the mark which was the detection target in step S68, and most distant from a center 11 of the substrate W may be selected from these "XY mark"s, and set as a "detection mark having a substitution mark". An "XY mark" closest to the mark which was the detection target in step S68 is selected because the difference in detection result between the selected mark and the mark which was the detection target in step S68 is small, and a decrease in alignment accuracy can be suppressed. An "XY mark" most distant from the center 11 of the substrate W is selected because the influence of distortion of the substrate W becomes larger as a mark becomes more distant from the center 11 of the substrate W, and the accuracy of alignment between the substrate W and the mask M is improved by using the detection result of this mark.

If no "XY mark" exists, the process advances to step S103, and the control unit 28 determines whether one "X mark" and one "Y mark" exist in the same group as that of the mark which was the detection target in step S68. If one "X mark" and one "Y mark" exist, the process advances to step S104, and the control unit 28 sets each of the "X mark" and "Y mark" as a "detection mark having a substitution mark". That is, a position in the X direction is determined from the detection result of one of the two marks which are arranged in different shot regions and belong to the same group. A position in the Y direction is determined from the detection result of the other mark. If a plurality of "X mark"s are detected in step S103, an "X mark" closest to the mark which was the detection target in step S68, and most distant from the center 11 of the substrate W may be selected from these "X mark"s. Similarly, if a plurality of "Y mark"s are detected in step S103, a "Y mark" closest to the mark which was the detection target in step S68, and most distant from the center 11 of the substrate W may be selected from these "Y mark"s. If one "X mark" and one "Y mark" do not exist, the process advances to step S105, and the control unit 28 sets the detected "X mark" or "Y mark" as a "detection mark having a substitution mark". In step S106, the control unit 28 sets, as a "substitution mark", a mark (mark for which an abnormality has occurred in detection) which was the detection target in step S68. The processing in step S73 has an advantage in which the alignment accuracy can be improved because, even if an abnormality occurs in detection of a mark, a detection result can be obtained from another mark.

For example, assume that an abnormality occurs when the mark $S_8M_1XY$ set as a "detection mark having a substitution mark" in FIG. 7 is detected in step S68. At this time, the control unit 28 determines in step S101 whether an "XY mark" exists in the same group $S_8C$ as that of the mark $S_8M_1XY$. In step S102, the control unit 28 sets the mark $S_1M_4XY$ serving as an "XY mark" in the group $S_8C$ as a "detection mark having a substitution mark". Then, the control unit 28 sets the mark $S_8M_1XY$ as a "substitution mark". FIG. 11 is a view showing an example of information of each mark when the process of step S47 is performed in this example.

FIG. 11 is a view showing an example of the information 97 of each mark when the control unit 28 performs the processes of steps S41 to S47. In FIG. 11, attention is paid to pieces of information of the marks $S_1M_4XY$, $S_2M_2X$, $S_8M_1XY$, and $S_9M_3Y$ belonging to the group $S_8C$. By performing the processes of steps S41 to S47, the detection unit 10 detects the position of only the mark $S_8M_1XY$ set as a "detection mark having a substitution mark" in the group $S_8C$. As shown in FIG. 11, detection results (x8 and y8) in the mark $S_8M_1XY$ set as a "detection mark having a substitution mark" are input as position data for the marks $S_1M_4XY$, $S_2M_2X$, and $S_9M_3Y$ each set as a "substitution mark". Although the detection result of a "detection mark having a substitution mark" is directly input as position data for a "substitution mark" in the first embodiment, the present invention is not limited to this. For example, the distance in design data between a "detection mark having a substitution mark" and a "substitution mark" may be added to the detection result of the "detection mark having a substitution mark", and the result may be input as position data for the "substitution mark".

As described above, according to the first embodiment, by performing the processes of steps S41 to S47, position data of each mark can be obtained without detecting all marks on a substrate by the detection unit 10. In step S48, the position of each shot region formed on the substrate can be determined based on position data of each of a plurality of marks arranged in each shot region. That is, when measuring the position of each shot region, the number of marks to be detected by the detection unit 10 can be decreased to greatly improve the throughput.

Second Embodiment

Figure 12:
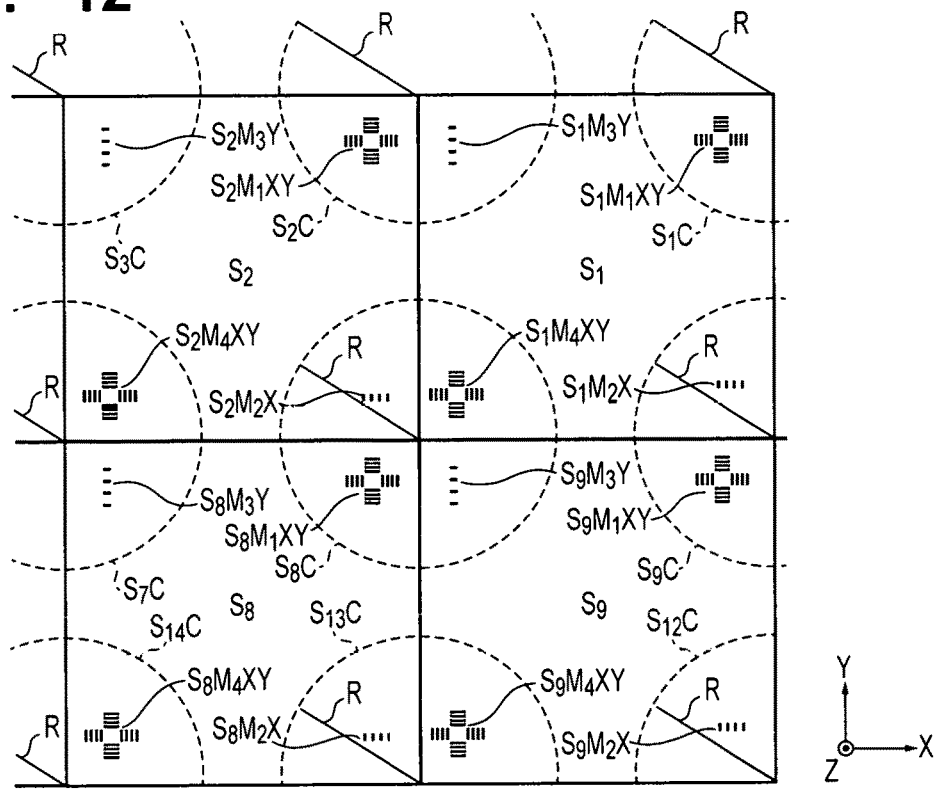
FIG. 12 is an enlarged view showing four next shot regions.

In the first embodiment, one of a plurality of marks arranged in one shot region is set as a representative mark, and a range having the distance R from a representative mark serving as the center is set as a specified range. Then, marks contained in the specified range are defined as marks belonging to the same group. To the contrary, in the second embodiment, a range having a distance R from, as the center, a reference point 12 between next shot regions is set as a specified range, as shown in FIG. 12. Then, marks contained in the specified range are defined as marks belonging to the same group.

Figure 13:
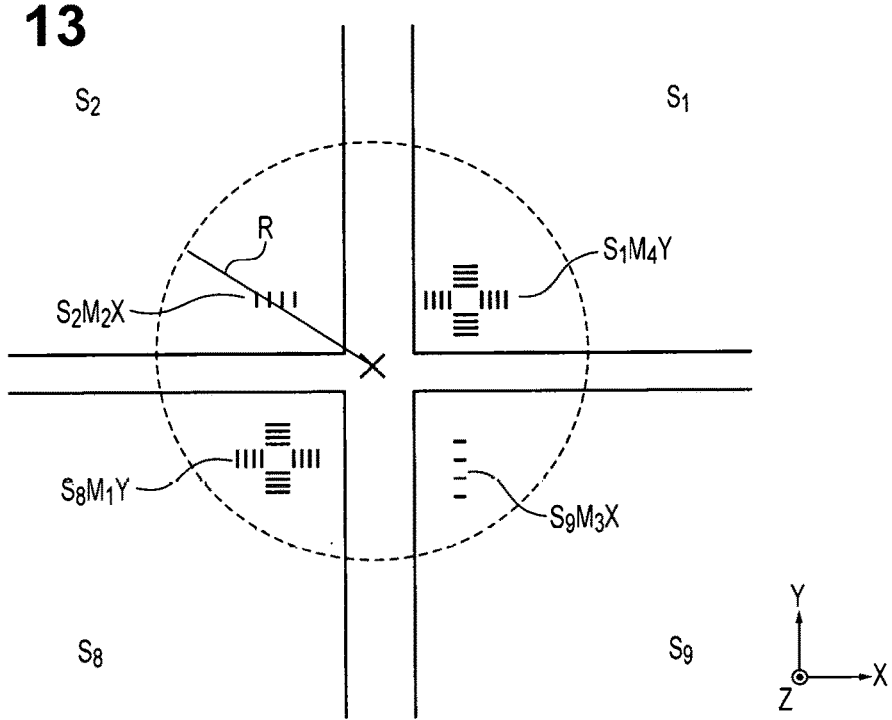
FIG. 13 is a view showing a reference point arranged between four next shot regions.
Figure 14:
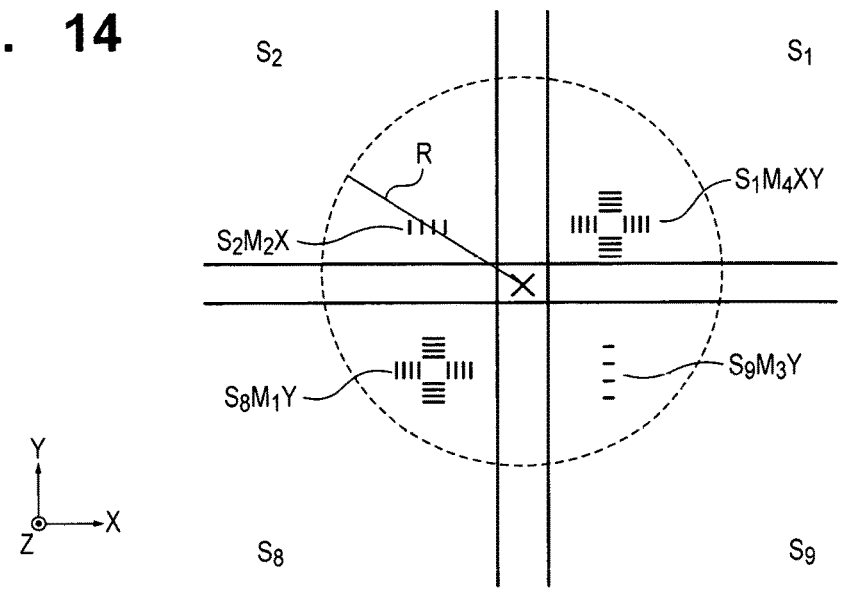
FIG. 14 is a view showing a reference point arranged between four next shot regions.
Figure 15:
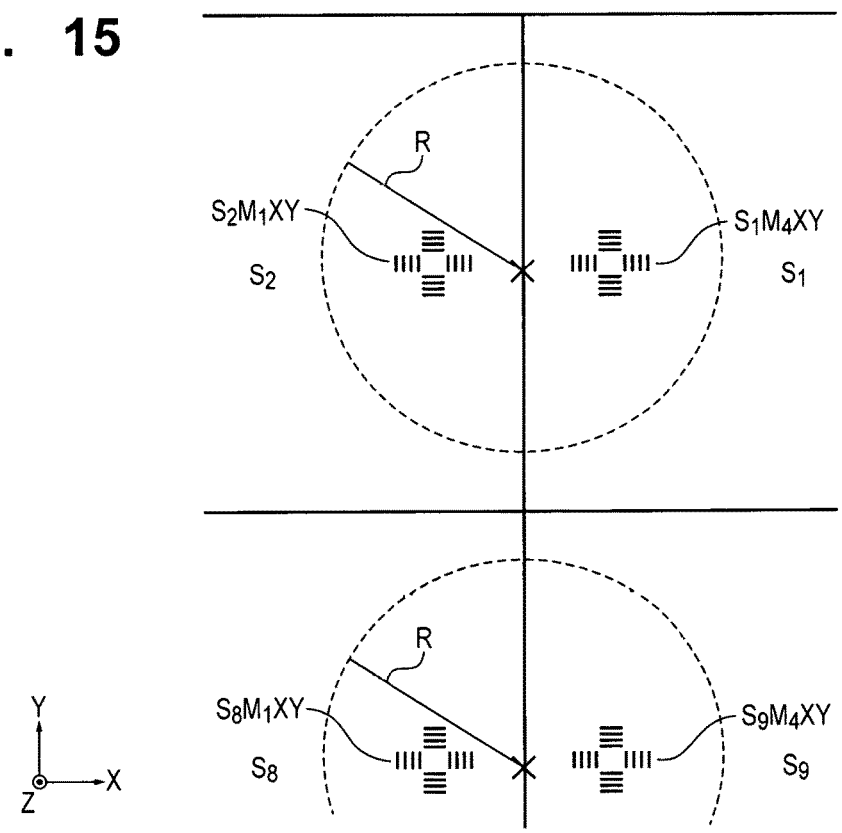
FIG. 15 is a view showing a reference point arranged between four next shot regions.

FIG. 12 is an enlarged view showing four next shot regions $S_1$, $S_2$, $S_8$, and $S_9$, out of 32 shot regions formed on a substrate, as shown in FIG. 3. For example, four next shot regions may be arranged to be apart from each other, as shown in FIG. 13, or arranged to partially overlap each other, as shown in FIG. 14. In these cases, the reference point 12 is set to, for example, maximize the number of marks contained in a range (specified range) having the distance R from the reference point 12 serving as the center. When marks are arranged at the four corners of each shot region, the reference point 12 may be arranged at a position shown in FIG. 13 or 14. When marks are arranged not at the four corners of each shot region, but near the center of each shot region in the Y direction, as shown in FIG. 15, the reference point 12 can be arranged at a position shown in FIG. 15. An exposure apparatus according to the second embodiment has the same apparatus arrangement as that of the exposure apparatus 100 according to the first embodiment, and a description of the apparatus arrangement will not be repeated. An example of a measurement method of measuring the position of each of a plurality of shot regions formed on a substrate in the exposure apparatus according to the second embodiment will be explained.

First, as an initial stage, information of marks arranged in one shot region, conditions in detecting marks by a detection unit 10, and the like are set. FIG. 16 shows a screen 113 which is displayed on the I/O interface of a control unit 28 when setting information of marks arranged in one shot region, conditions in detecting marks by the detection unit 10, and the like. Unlike the screen 90 shown in FIG. 5, the screen 113 shown in FIG. 16 does not have the item "Center" for setting, as a representative mark, one of a plurality of marks arranged in one shot region. This is because, in the second embodiment, marks are grouped by the range having the distance R from, as the center, the reference point 12 between next shot regions without setting a representative mark.

Figure 17:
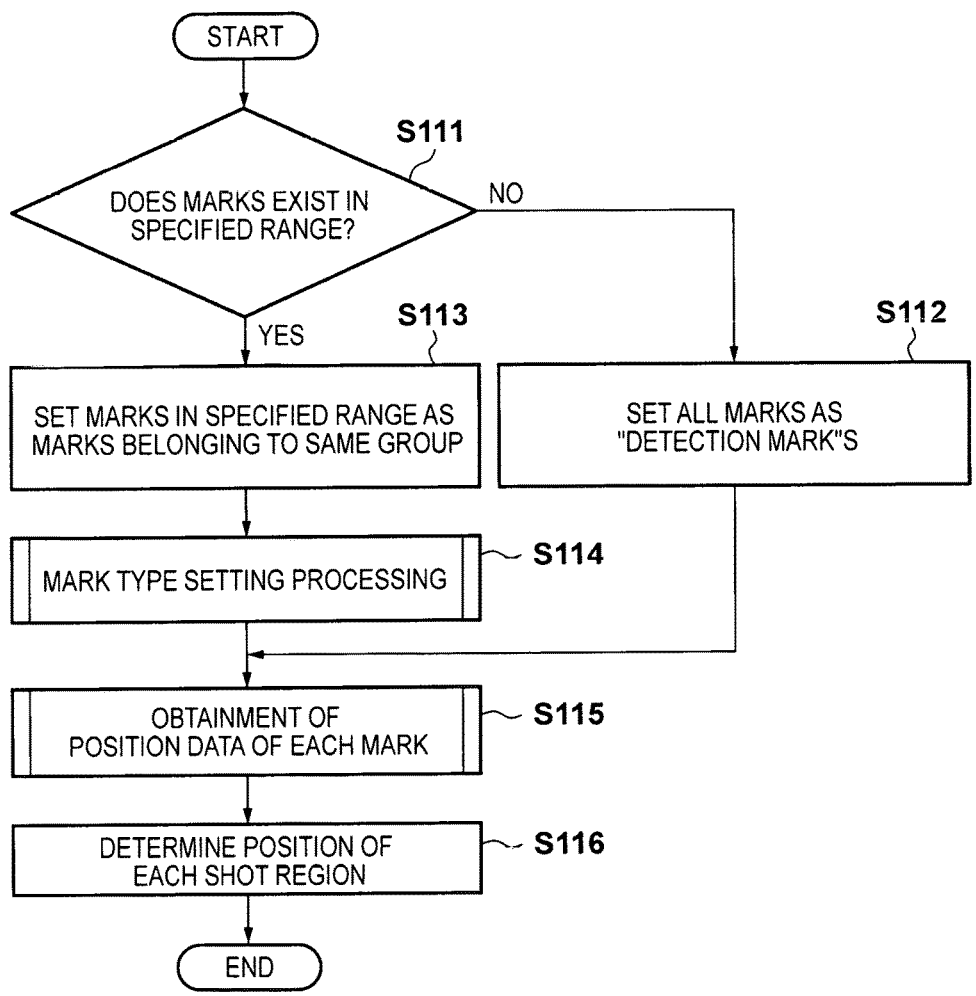
FIG. 17 is a flowchart showing a measurement method of measuring the position of each shot region.

Next, an example of the measurement method of measuring the position of each of a plurality of shot regions formed on a substrate will be explained with reference to FIG. 17. FIG. 17 is a flowchart showing the measurement method of measuring the position of each shot region. The control unit 28 can execute the processes of the flowchart shown in FIG. 17.

In step S111, the control unit 28 determines whether marks exist in the specified range. In the second embodiment, as described above, the specified range is a range having the distance R or smaller from, as the center, the reference point 12 between next shot regions. If no mark exists in the specified range, the process advances to step S112, and the control unit 28 sets all marks in each shot regions as "detection mark"s whose positions are detected by the detection unit 10. If marks exist in the specified range, the process advances to step S113, and the control unit 28 sets the marks in the specified range as marks belonging to the same group.

In step S114, the control unit 28 sets a method (mark type) of obtaining position data for each mark in the specified range. More specifically, in step S114, the control unit 28 sets one of a "detection mark", "substitution mark", and "detection mark having a substitution mark" for each mark in the specified range. Details of the processing in step S114 will be described later. In step S115, the control unit 28 obtains position data of each mark based on information of each mark. The processing in step S115 is the same as that in step S47 of FIG. 6, and a description thereof will not be repeated. In step S116, the control unit 28 determines the position of each shot region in the stage coordinate system based on the position data of each mark. In step S116, the control unit 28 can also determine the shape (for example, rotation or shift) of each shot region based on the position data of each mark.

Figure 18:
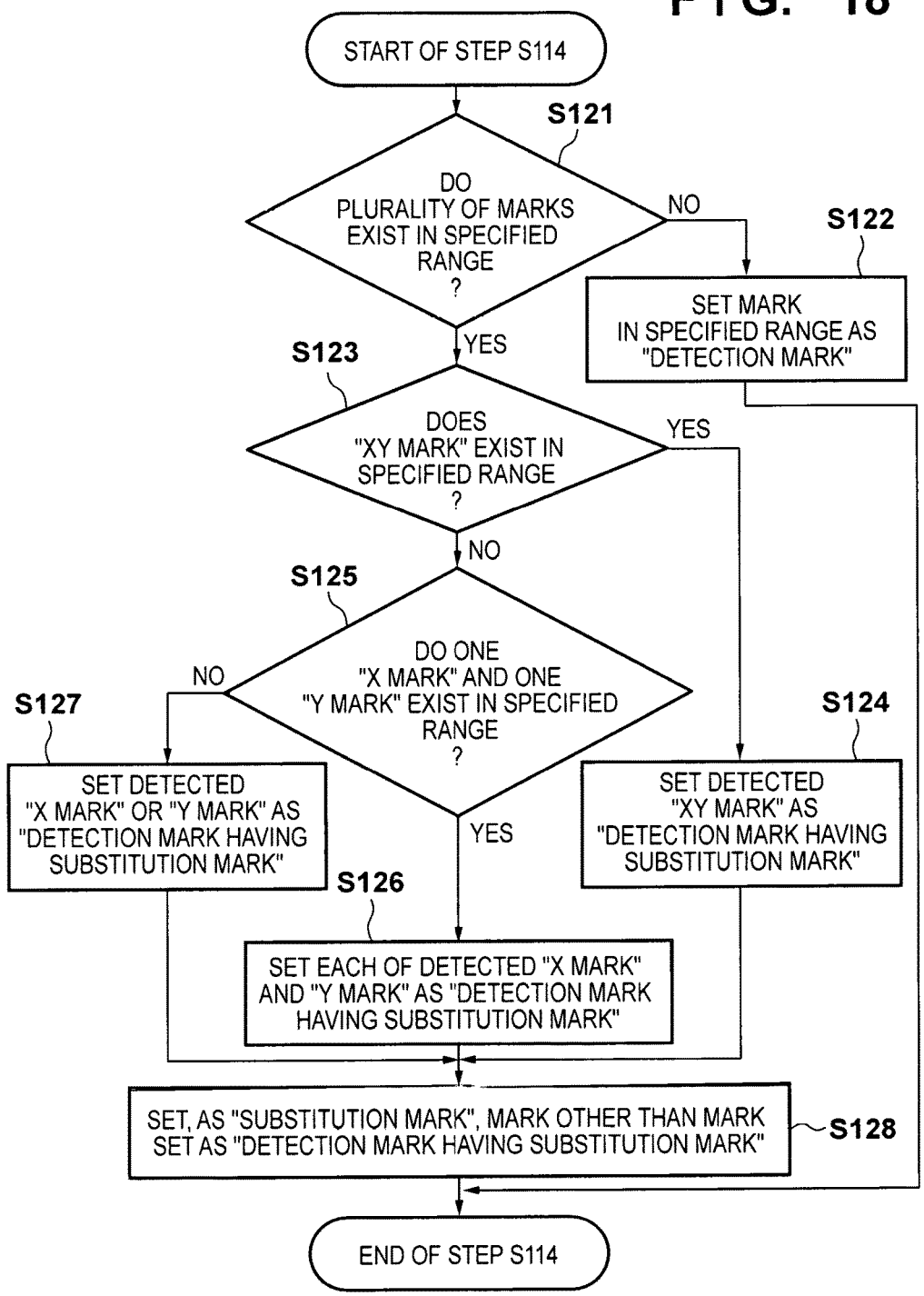
FIG. 18 is a flowchart showing processing of setting a method of obtaining position data.

The processing in step S114 will be described with reference to FIG. 18. FIG. 18 is a flowchart showing the processing of setting a method of obtaining position data for each mark. The control unit 28 can execute the processes of the flowchart shown in FIG. 18.

In step S121, the control unit 28 determines whether a plurality of marks exist in the specified range (group). If a plurality of marks do not exist, the process advances to step S122, and the control unit 28 sets a mark in the shot region as a "detection mark". If a plurality of marks exist, the process advances to step S123, and the control unit 28 determines whether an "XY mark" exists in the specified range. If an "XY mark" exists in the specified range, the process advances to step S124, and the control unit 28 sets the "XY mark" as a "detection mark having a substitution mark". If a plurality of "XY mark"s are detected in step S123, an "XY mark" closest to the reference point 12 and most distant from a center 11 of a substrate W may be selected from these "XY mark"s, and set as a "detection mark having a substitution mark". If no "XY mark" exists in the specified range, the process advances to step S125, and the control unit 28 determines whether one "X mark" and one "Y mark" exist in the specified range.

If one "X mark" and one "Y mark" exist in step S125, the process advances to step S126, and the control unit 28 sets each of the "X mark" and "Y mark" as a "detection mark having a substitution mark". If a plurality of "X mark"s are detected in step S125, an "X mark" closest to the reference point 12 and most distant from the center 11 of the substrate W may be set as a "detection mark having a substitution mark". Similarly, if a plurality of "Y mark"s are detected in step S125, a "Y mark" closest to the reference point 12 and most distant from the center 11 of the substrate W may be set as a "detection mark having a substitution mark". If one "X mark" and one "Y mark" do not exist, the process advances to step S127, and the control unit 28 sets the detected "X mark" or "Y mark" as a "detection mark having a substitution mark". In step S128, the control unit 28 sets, as a "substitution mark", a mark in the specified range except for the mark set as a "detection mark having a substitution mark".

For example, specified ranges (ranges $S_1C$, $S_2C$, . . . , $S_{14}C$) each having the distance R from, as the center, the reference point 12 between next shot regions are set, as represented by broken lines in FIG. 12. Some specified ranges set in this fashion contain a plurality of marks, and others do not. For example, the range $S_1C$ contains only a mark $S_1M_1XY$. The mark $S_1M_1XY$ is therefore set as a "detection mark" in step S122. In contrast, the range $S_8C$ contains a plurality of marks $S_8M_1XY$, $S_1M_4XY$, $S_2M_2X$, and $S_9M_3Y$. Further, the range $S_8C$ contains two marks $S_8M_1XY$ and $S_1M_4XY$ serving as "XY mark"s. Of these two marks, the mark $S_1M_4XY$ closest to the reference point 12 and most distant from the center of the substrate W is set as a "detection mark having a substitution mark" in step S124. The marks $S_8M_1XY$, $S_2M_2X$, and $S_8M_3Y$ contained in the range $S_8C$, other than the mark $S_1M_4XY$, are set as "substitution mark"s in step S128.

As described above, according to the second embodiment, as in the first embodiment, the position of each shot region formed on a substrate can be measured without detecting all marks on the substrate by the detection unit 10. Since the number of marks to be detected by the detection unit 10 can be decreased, the throughput can be greatly improved.

The first and second embodiments have described a form in which two shot regions (first and second shot regions) are next to each other. Needless to say, the present invention is also applicable to a form in which two shot regions are not next to each other but are arranged in the vicinity in a case where, for example, the dimensions of a shot region are sufficiently small.

Third Embodiment

The first and second embodiments have described a form in which the position of a shot region is obtained by the die-by-die alignment method. However, the present invention is also applicable to a form in which the positions of a plurality of shot regions are obtained by the global alignment method.

For example, assume that the positions of a plurality of shot regions formed on a substrate are obtained. In this case, an exposure apparatus 100 selects the first and second shot regions next to each other from the plurality of shot regions. A detection unit 10 detects the position of the first mark arranged in the first shot region. The detection unit 10 detects the position of a mark more distant from the first mark, out of the second and third marks arranged in the second shot region next to the first shot region. Based on the detection results of the detection unit 10, the positions of a plurality of shot regions are determined.

As the third embodiment, an example of a method of detecting the position of a mark arranged in a sample shot region to obtain the positions of a plurality of shot regions by the global alignment method will be explained.

Figure 19:
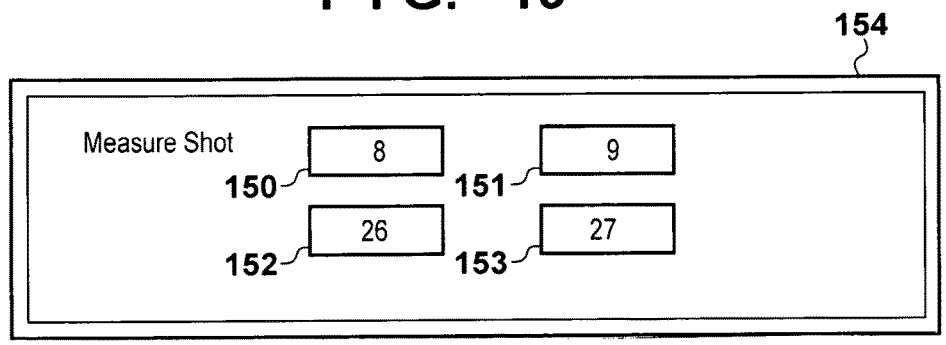
FIG. 19 is a view showing a screen displayed on the I/O interface of the control unit.

First, as an initial stage, information of marks arranged in one shot region, conditions in detecting marks by the detection unit, and the like are set, and a sample shot region when executing global alignment is selected. The information and conditions can be set in, for example, a screen 113 shown in FIG. 16. The sample shot region can be selected in, for example, a screen 154 shown in FIG. 19. FIG. 19 is a view showing the screen 154 which is displayed on the I/O interface of a control unit 28 when selecting a sample shot region. In the screen 154 shown in FIG. 19, "Measure Shot" is an item for selecting, from a plurality of shot regions, a sample shot region when performing global alignment. In "Measure Shot" fields 150 to 153 shown in FIG. 19, "8", "9", "26", and "27" are input, respectively, and shot regions $S_8$, $S_9$, $S_{26}$, and $S_{27}$ are selected as sample shot regions.

Figure 20:
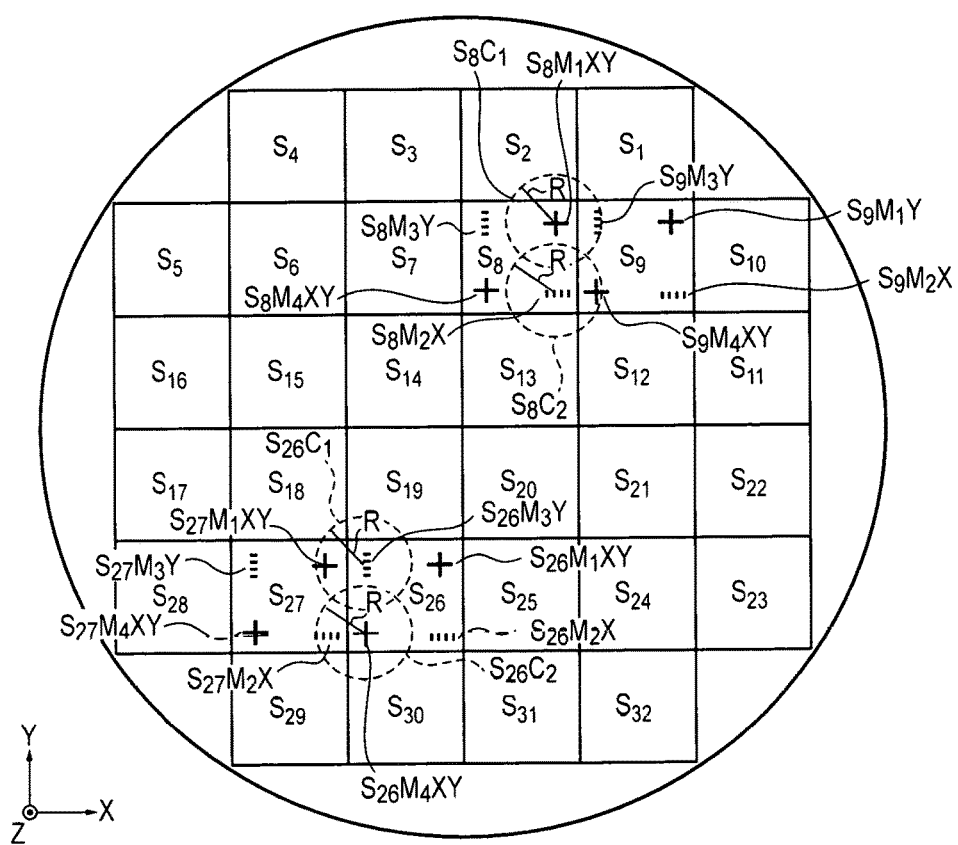
FIG. 20 is a view showing the layout of a plurality of shot regions formed on a substrate.
Figure 21:
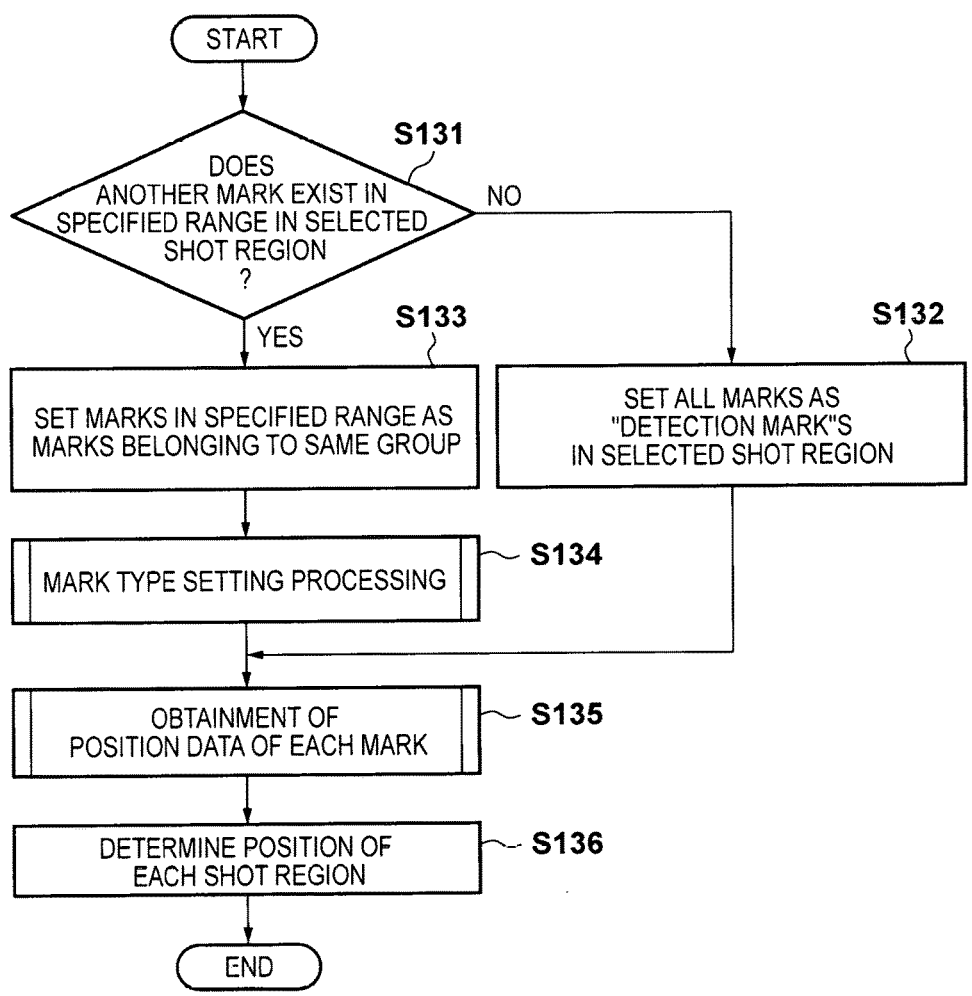
FIG. 21 is a flowchart showing a measurement method of measuring a position in a sample shot region.

Next, an example of a measurement method of measuring a position in a sample shot region will be explained with reference to FIGS. 20 and 21. FIG. 20 is a view showing the layout of a plurality (32) of shot regions formed on a substrate. As described above, the shot regions $S_8$, $S_9$, $S_{26}$, and $S_{27}$ are selected as sample shot regions from the plurality of shot regions. FIG. 21 is a flowchart showing the measurement method of measuring a position in a sample shot region. The control unit 28 can execute the processes of the flowchart shown in FIG. 21.

In step S131, the control unit 28 determines whether another mark exists in a range (specified range) having a distance R or smaller from, as the center, each mark in a sample shot region. If no other mark exists in the specified range, the process advances to step S132, and the control unit 28 sets all marks in the sample shot region as "detection mark"s. If another mark exists in the specified range, the process advances to step S133, and the control unit 28 sets marks contained in the specified range as marks belonging to the same group. For example, a range $S_{26}C_1$ having a mark $S_{26}M_3Y$ in the shot region $S_{26}$ as the center contains a mark $S_{27}M_1XY$ in the shot region $S_{27}$. Thus, the marks $S_{26}M_3Y$ and $S_{27}M_1XY$ are set as marks belonging to the same group. Similarly, a mark $S_{26}M_4XY$ in the shot region $S_{26}$ and a mark $S_{27}M_2X$ in the shot region $S_{27}$ are set as marks belonging to the same group. Also, a range $S_8C_1$ having a mark $S_8M_1XY$ in the shot region $S_8$ as the center contains a mark $S_9M_3Y$ in the shot region $S_9$. Hence, the marks $S_8M_1XY$ and $S_9M_3Y$ are set as marks belonging to the same group. Similarly, a mark $S_8M_2X$ in the shot region $S_8$ and a mark $S_9M_4XY$ in the shot region $S_9$ are set as marks belonging to the same group.

In step S134, the control unit 28 sets a method (mark type) of obtaining position data for each mark in the specified range. More specifically, in step S134, the control unit 28 sets one of a "detection mark", "substitution mark", and "detection mark having a substitution mark" for each mark in the specified range. The processing in step S134 is the same as that in step S114 of FIG. 17, and a description thereof will not be repeated. In step S135, the control unit 28 obtains position data of each mark based on information of each mark. The processing in step S135 is the same as that in step S47 of FIG. 6, and a description thereof will not be repeated. In step S136, the control unit 28 determines the position of each shot region in the stage coordinate system based on the position data of each mark. In step S136, the control unit 28 can also determine, for example, the rotation error and shape error (for example, magnification error and distortion error) of each shot region with respect to a target shot region (shot region serving as a reference in design) based on the position data of each mark.

As described above, according to the third embodiment, the position of a sample shot region can be measured without detecting all marks in the sample shot region by the detection unit 10. Since the number of marks to be detected by the detection unit 10 can be decreased, the throughput can be greatly improved.

Figure 22:
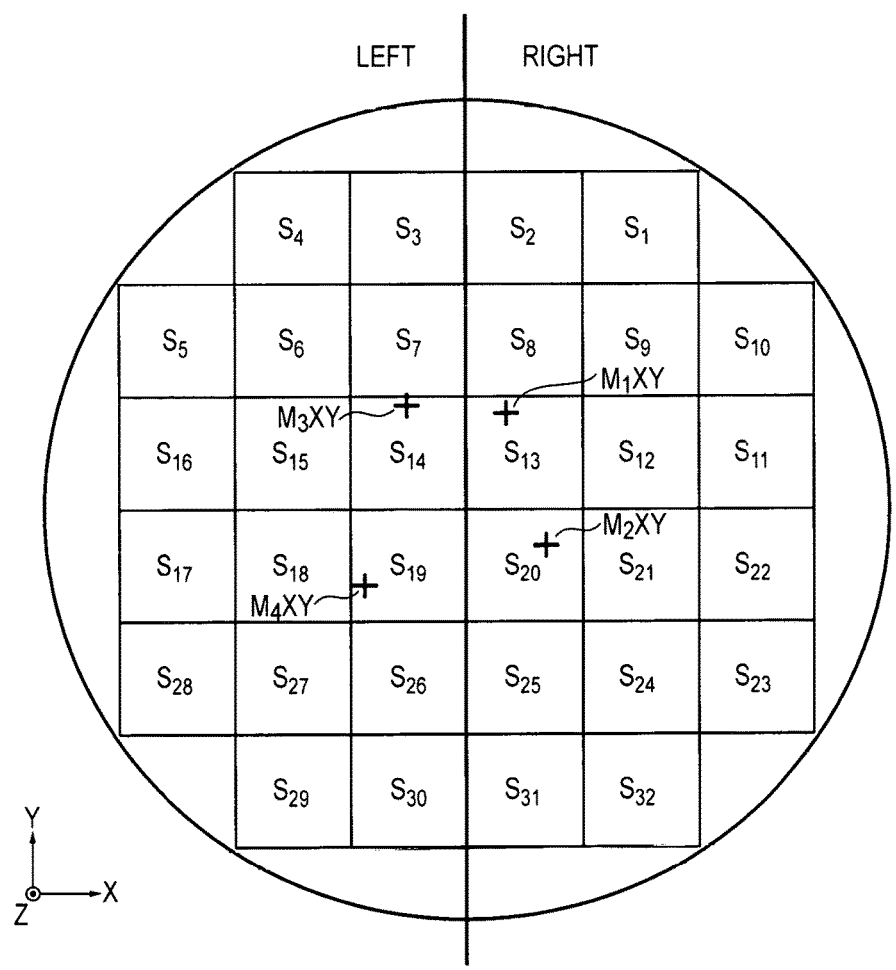
FIG. 22 is a view showing the layout of a plurality of shot regions formed on a substrate.

The first and second embodiments have described a form in which the position of a shot region is obtained by the die-by-die alignment method. The third embodiment has described a form in which the position of a shot region is obtained by the global alignment method. However, the present invention is not limited to them. As a matter of course, the present invention is also applicable to a form in which the position of a zone (shot region group) including a plurality of shot regions is obtained by a zone alignment method. For example, assume that the positions of a first shot region group Left and second shot region group Right are obtained, as shown in FIG. 22. The first shot region group Left includes a first shot region $S_{14}$ and second shot region $S_{19}$ next to each other, out of a plurality of shot regions formed on a substrate. The second shot region group Right includes a third shot region $S_{13}$ and fourth shot region $S_{20}$ next to each other, out of a plurality of shot regions formed on the substrate. In this case, the detection unit 10 in the exposure apparatus 100 detects the position of one of a mark $M_3XY$ arranged in the first shot region $S_{14}$ and a mark $M_4XY$ arranged in the second shot region $S_{19}$. Also, the detection unit 10 in the exposure apparatus 100 detects the position of one of a mark $M_1XY$ arranged in the third shot region $S_{13}$ and a mark $M_2XY$ arranged in the fourth shot region $S_{20}$. Based on the detection results of the detection unit 10, the positions of the first shot region group Left and second shot region group Right can be determined.

<Embodiment of Method of Manufacturing Article>

A method of manufacturing an article according to the embodiment of the present invention is suitable for manufacturing an article such as a microdevice (for example, a semiconductor device) or an element having a microstructure. The method of manufacturing an article according to the embodiment includes a step of forming, by using the above-described exposure apparatus, a latent image pattern on a photoresist applied to a substrate (a step of exposing a substrate), and a step of developing the substrate on which the latent image pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2013-187644 filed on Sep. 10, 2013, which is hereby incorporated by reference herein in its entirety.

What is claimed is:

1. A method of obtaining a position of a second shot region different from a first shot region, of a plurality of shot regions formed on a substrate, implemented by a control unit configured to cause a detection unit to detect a mark formed on the substrate, the method comprising:
 a first detection step of detecting, by the detection unit, a position of a first mark arranged with respect to the first shot region;
 a second detection step of detecting, by the detection unit, a position of a mark which is more distant from the first mark and whose distance from the first mark is greater than a predetermined distance, of a second mark and a third mark arranged with respect to the second shot region; and
 a determination step of determining the position of the second shot region based on a detection result in the first detection step and a detection result in the second detection step,
 wherein the substrate is positioned based on the determined position of the second shot region.

2. The method according to claim 1, wherein in the determination step, at least one of a rotation error and shape error of the second shot region with respect to a target shot region is further determined based on the detection result in the first detection step and the detection result in the second detection step.

3. The method according to claim 1, wherein the first mark is configured such that positions thereof are detectable in a first direction and a second direction perpendicular to each other on a plane parallel to a surface of the substrate.

4. The method according to claim 3, wherein a mark closer to the first mark, of the second mark and the third mark, is configured such that a position thereof is detectable in one of the first direction and the second direction.

5. The method according to claim 3, wherein the second shot region is arranged to be next to the first shot region in the first direction.

6. The method according to claim 3, wherein the second shot region is arranged to be next in the second direction to a shot region which is arranged to be next to the first shot region in the first direction.

7. The method according to claim 1, further comprising a setting step of setting the predetermined distance based on a dimension of the second shot region.

8. The method according to claim 1, wherein the predetermined distance is not larger than half of a length of a shorter side of the second shot region.

9. The method according to claim 1, wherein the predetermined distance is not larger than a distance between the second mark and the third mark.

10. The method according to claim 1, wherein
 in the first detection step, a position of the first mark in one of a first direction and second direction perpendicular to each other on a plane parallel to a surface of the substrate is detected, and
 in the determination step, the position of the second shot region is determined further based on a position, in the other of the first direction and the second direction, of a fourth mark which is arranged with respect to a third shot region next to the first shot region and the second shot region, and whose distance from the first mark is not greater than the predetermined distance.

11. The method according to claim 1, wherein in the first detection step, in a case where the position of the first mark cannot be normally detected, a position of a mark which is different from the first mark and whose distance from the first mark is not greater than the predetermined distance is detected.

12. The method according to claim 1, wherein the first mark is longer in distance from a center of the substrate than a mark which is different from the first mark and whose distance from the first mark is not greater than the predetermined distance.

13. The method according to claim 1, wherein the second shot region is arranged in a vicinity of the first shot region.

14. The method according to claim 1, further comprising a selection step of selecting the first shot region and the second shot region next to each other, of the plurality of shot regions.

15. The method according to claim 1, wherein the second shot region is next to the first shot region.

16. The method according to claim 1, wherein in the second detection step, a position of a mark closer to the first mark, of the second mark and the third mark, is not detected.

17. A method of obtaining a position of a second shot region different from a first shot region, of a plurality of shot regions formed on a substrate, implemented by a control unit configured to cause a detection unit to detect a mark formed on the substrate, the method comprising:
- a first detection step of detecting, by the detection unit, a position of a first mark arranged with respect to the first shot region;
- a second detection step of detecting, by the detection unit, a position of a mark which is more distant from the first mark whose distance from a reference point between the first shot region and the second shot region is greater than a predetermined distance, of a second mark and a third mark arranged with respect to the second shot region; and
- a determination step of determining the position of the second shot region based on a detection result in the first detection step and a detection result in the second detection step,
- wherein the substrate is positioned based on the determined position of the second shot region.

18. The method according to claim 17, wherein the predetermined distance is not larger than half of a length of a shorter side of the second shot region.

19. The method according to claim 17, wherein the predetermined distance is not larger than a distance between the second mark and the third mark.

20. The method according to claim 17, wherein
- in the first detection step, a position of the first mark in one of a first direction and second direction perpendicular to each other on a plane parallel to a surface of the substrate is detected, and
- in the determination step, the position of the second shot region is determined further based on a position, in the other of the first direction and the second direction, of a fourth mark which is arranged with respect to a third shot region next to the first shot region and the second shot region, and whose distance from the reference point is not greater than the predetermined distance.

21. The method according to claim 17, wherein in the first detection step, in a case where the position of the first mark cannot be normally detected, a position of a mark which is different from the first mark and whose distance from the reference point is not greater than the predetermined distance is detected.

22. The method according to claim 17, wherein the first mark is longer in distance from a center of the substrate than a mark which is different from the first mark and whose distance from the reference point is not greater than the predetermined distance.

23. A method of obtaining a position of a second shot region different from a first shot region, of a plurality of shot regions formed on a substrate, implemented by a control unit configured to cause a detection unit to detect a mark formed on the substrate, the method comprising:
- a detection step of detecting, by the detection unit, a position of a mark which is more distant from a mark arranged with respect to the first shot region and whose distance from a reference point between the first shot region and the second shot region is greater than a predetermined distance, of marks arranged with respect to the second shot region; and
- a determination step of determining the position of the second shot region based on a position of a mark arranged with respect to the first shot region, and a detection result in the detection step,
- wherein the substrate is positioned based on the determined position of the second shot region.

24. An exposure method of exposing a substrate, the method comprising the steps of:
- obtaining a position of each of a plurality of shot regions formed on the substrate by using a method of obtaining a position; and
- positioning the substrate based on the obtained position,
- wherein the method of obtaining the position is a method of obtaining a position of a second shot region different from a first shot region, of the plurality of shot regions formed on the substrate, and
- wherein the method of obtaining the position includes:
- a first detection step of detecting a position of a first mark arranged with respect to the first shot region;
- a second detection step of detecting a position of a mark which is more distant from the first mark and whose distance from the first mark is greater than a predetermined distance, of a second mark and a third mark arranged with respect to the second shot region; and
- a determination step of determining the position of the second shot region based on a detection result in the first detection step and a detection result in the second detection step.

25. A method of manufacturing an article, comprising the steps of:
- coating a substrate with a photoresist; and
- exposing the coated substrate using an exposure method,
- wherein the exposure method includes the steps of:
- obtaining a position of each of a plurality of shot regions formed on the substrate by using a method of obtaining a position; and
- positioning the substrate based on the obtained position,
- wherein the method of obtaining the position is a method of obtaining a position of a second shot region different from a first shot region, of the plurality of shot regions formed on the substrate, and
- wherein the method of obtaining the position includes:
- a first detection step of detecting a position of a first mark arranged with respect to the first shot region;
- a second detection step of detecting a position of a mark which is more distant from the first mark and whose distance from the first mark is greater than a predetermined distance, of a second mark and a third mark arranged with respect to the second shot region; and
- a determination step of determining the position of the second shot region based on a detection result in the first detection step and a detection result in the second detection step.

26. An exposure method of exposing a substrate, the method comprising the steps of:
- obtaining a position of each of a plurality of shot regions formed on the substrate by using a method of obtaining a position; and
- positioning the substrate based on the obtained position,
- wherein the method of obtaining the position is a method of obtaining a position of a second shot region different from a first shot region, of the plurality of shot regions formed on the substrate, and
- wherein the method of obtaining the position includes:
- a first detection step of detecting a position of a first mark arranged with respect to the first shot region;
- a second detection step of detecting a position of a mark which is more distant from the first mark and whose distance from a reference point between the first shot region and the second shot region is greater than a predetermined distance, of a second mark and a third mark arranged with respect to the second shot region; and a determination step of determining the position of the second shot region based on a detection result in the first detection step and a detection result in the second detection step.

27. A method of manufacturing an article, comprising the steps of:
- coating a substrate with a photoresist; and
- exposing the coated substrate using an exposure method, wherein the exposure method includes the steps of:
- obtaining a position of each of a plurality of shot regions formed on the substrate by using a method of obtaining a position; and
- positioning the substrate based on the obtained position, wherein the method of obtaining the position is a method of obtaining a position of a second shot region different from a first shot region, of the plurality of shot regions formed on the substrate, and wherein the method of obtaining the position includes:
- a first detection step of detecting a position of a first mark arranged with respect to the first shot region;
- a second detection step of detecting a position of a mark which is more distant from the first mark and whose distance from a reference point between the first shot region and the second shot region is greater than a predetermined distance, of a second mark and a third mark arranged with respect to the second shot region; and
- a determination step of determining the position of the second shot region based on a detection result in the first detection step and a detection result in the second detection step.

\* \* \* \* \*